US008664644B2

(12) United States Patent
Nathan et al.

(10) Patent No.: US 8,664,644 B2
(45) Date of Patent: Mar. 4, 2014

(54) PIXEL DRIVER CIRCUIT AND PIXEL CIRCUIT HAVING THE PIXEL DRIVER CIRCUIT

(75) Inventors: Arokia Nathan, Cambridge (GB); Peyman Servati, Waterloo (CA); Kapil Sakariya, Santa Clara, CA (US); Anil Kumar, Kitchener (CA)

(73) Assignee: Ignis Innovation Inc., Waterloo, ON (CA)

( * ) Notice: Subject to any disclaimer, the term of this patent is extended or adjusted under 35 U.S.C. 154(b) by 499 days.

(21) Appl. No.: 13/089,622

(22) Filed: Apr. 19, 2011

(65) Prior Publication Data

US 2011/0193834 A1    Aug. 11, 2011

Related U.S. Application Data

(63) Continuation of application No. 12/504,510, filed on Jul. 16, 2009, now abandoned, which is a continuation of application No. 11/220,094, filed on Sep. 6, 2005, now Pat. No. 7,569,849, which is a continuation-in-part of application No. 10/468,319, filed as application No. PCT/CA02/00173 on Feb. 18, 2002, now abandoned.

(60) Provisional application No. 60/268,900, filed on Feb. 16, 2001.

(51) Int. Cl.
    *H01L 35/24*    (2006.01)
(52) U.S. Cl.
    USPC .................................. 257/40; 257/13; 257/79
(58) Field of Classification Search
    USPC ............................................. 257/40, 13, 79
    See application file for complete search history.

(56) References Cited

U.S. PATENT DOCUMENTS

| 4,354,162 A | 10/1982 | Wright |
| 4,758,831 A | 7/1988 | Kasahara et al. |
| 4,963,860 A | 10/1990 | Stewart |
| 4,975,691 A | 12/1990 | Lee |
| 4,996,523 A | 2/1991 | Bell et al. ...................... 340/781 |
| 5,051,739 A | 9/1991 | Hayashida et al. |
| 5,222,082 A | 6/1993 | Plus |
| 5,266,515 A | 11/1993 | Robb et al. ...................... 437/56 |
| 5,498,880 A | 3/1996 | Lee et al. ...................... 250/580 |
| 5,589,847 A | 12/1996 | Lewis |
| 5,619,033 A | 4/1997 | Weisfield .................. 250/208.1 |
| 5,648,276 A | 7/1997 | Hara et al. ...................... 437/21 |

(Continued)

FOREIGN PATENT DOCUMENTS

| CA | 1294034 | 1/1992 |
| CA | 2109951 | 11/1992 |

(Continued)

OTHER PUBLICATIONS

European Search Report mailed Mar. 26, 2012 in corresponding European Patent Application No. 10000421.7 (6 pages).

(Continued)

*Primary Examiner* — Long Pham
(74) *Attorney, Agent, or Firm* — Nixon Peabody LLP

(57) ABSTRACT

A pixel driver circuit for driving a light-emitting element and a pixel circuit having the pixel driver circuit are provided. The pixel driver circuit includes a data line, address lines, switch thin film transistors, feedback thin film transistors and drive thin film transistors. The pixel circuit may include an organic light emitting diode, which is driven by the pixel driver circuit.

19 Claims, 28 Drawing Sheets

(56) References Cited

U.S. PATENT DOCUMENTS

| | | | |
|---|---|---|---|
| 5,670,973 A | 9/1997 | Bassetti et al. | |
| 5,686,935 A | 11/1997 | Weisbrod | |
| 5,712,653 A | 1/1998 | Katoh et al. | |
| 5,714,968 A | 2/1998 | Ikeda | 345/77 |
| 5,747,928 A | 5/1998 | Shanks et al. | |
| 5,748,160 A | 5/1998 | Shieh et al. | 345/82 |
| 5,784,042 A | 7/1998 | Ono et al. | |
| 5,790,234 A | 8/1998 | Matsuyama | |
| 5,815,303 A | 9/1998 | Berlin | |
| 5,870,071 A | 2/1999 | Kawahata | |
| 5,874,803 A | 2/1999 | Garbuzov et al. | 313/506 |
| 5,880,582 A | 3/1999 | Sawada | 323/315 |
| 5,903,248 A | 5/1999 | Irwin | 345/90 |
| 5,917,280 A | 6/1999 | Burrows et al. | 313/506 |
| 5,923,794 A | 7/1999 | McGrath et al. | |
| 5,952,789 A | 9/1999 | Stewart et al. | 315/169.4 |
| 5,990,629 A | 11/1999 | Yamada et al. | 315/169.3 |
| 6,023,259 A | 2/2000 | Howard et al. | 345/76 |
| 6,069,365 A | 5/2000 | Chow et al. | 250/551 |
| 6,091,203 A | 7/2000 | Kawashima et al. | 315/169.3 |
| 6,097,360 A | 8/2000 | Holloman | 345/84 |
| 6,144,222 A | 11/2000 | Ho | 326/82 |
| 6,177,915 B1 | 1/2001 | Beeteson et al. | |
| 6,229,508 B1 | 5/2001 | Kane | 345/82 |
| 6,232,939 B1 | 5/2001 | Saito et al. | |
| 6,246,180 B1 | 6/2001 | Nishigaki | 315/169.3 |
| 6,252,248 B1 | 6/2001 | Sano et al. | 257/59 |
| 6,259,424 B1 | 7/2001 | Kurogane | |
| 6,274,887 B1 | 8/2001 | Yamazaki et al. | |
| 6,288,696 B1 | 9/2001 | Holloman | 345/84 |
| 6,300,928 B1 | 10/2001 | Kim | |
| 6,303,963 B1 | 10/2001 | Ohtani et al. | |
| 6,306,694 B1 | 10/2001 | Yamazaki et al. | |
| 6,307,322 B1 | 10/2001 | Dawson et al. | 315/169.1 |
| 6,320,325 B1 | 11/2001 | Cok et al. | |
| 6,323,631 B1 | 11/2001 | Juang | 323/315 |
| 6,323,832 B1 | 11/2001 | Nishizawa et al. | |
| 6,345,085 B1 | 2/2002 | Yeo et al. | |
| 6,365,917 B1 | 4/2002 | Yamazaki | |
| 6,373,453 B1 | 4/2002 | Yudasaka | |
| 6,384,427 B1 | 5/2002 | Yamazaki et al. | |
| 6,392,617 B1 | 5/2002 | Gleason | 345/82 |
| 6,399,988 B1 | 6/2002 | Yamazaki | |
| 6,414,661 B1 | 7/2002 | Shen et al. | |
| 6,420,758 B1 | 7/2002 | Nakajima | |
| 6,420,834 B2 | 7/2002 | Yamazaki et al. | |
| 6,420,988 B1 | 7/2002 | Azami et al. | |
| 6,433,488 B1 | 8/2002 | Bu | 315/169.3 |
| 6,445,376 B2 | 9/2002 | Parrish | |
| 6,468,638 B2 | 10/2002 | Jacobsen et al. | |
| 6,489,952 B1 | 12/2002 | Tanaka et al. | |
| 6,501,098 B2 | 12/2002 | Yamazaki | |
| 6,501,466 B1 | 12/2002 | Yamagishi et al. | 345/204 |
| 6,512,271 B1 | 1/2003 | Yamazaki et al. | |
| 6,518,594 B1 | 2/2003 | Nakajima et al. | |
| 6,524,895 B2 | 2/2003 | Yamazaki et al. | |
| 6,531,713 B1 | 3/2003 | Yamazaki | |
| 6,559,594 B2 | 5/2003 | Fukunaga et al. | |
| 6,573,195 B1 | 6/2003 | Yamazaki et al. | |
| 6,573,584 B1 | 6/2003 | Nagakari et al. | |
| 6,576,926 B1 | 6/2003 | Yamazaki et al. | |
| 6,580,408 B1 | 6/2003 | Bae et al. | 345/76 |
| 6,580,657 B2 | 6/2003 | Sanford et al. | |
| 6,583,775 B1 | 6/2003 | Sekiya et al. | |
| 6,583,776 B2 | 6/2003 | Yamazaki et al. | |
| 6,587,086 B1 | 7/2003 | Koyama | |
| 6,593,691 B2 | 7/2003 | Nishi et al. | |
| 6,594,606 B2 | 7/2003 | Everitt | |
| 6,597,203 B2 | 7/2003 | Forbes | |
| 6,611,108 B2 | 8/2003 | Kimura | |
| 6,617,644 B1 | 9/2003 | Yamazaki et al. | |
| 6,618,030 B2 | 9/2003 | Kane et al. | |
| 6,641,933 B1 | 11/2003 | Yamazaki et al. | |
| 6,661,180 B2 | 12/2003 | Koyama | |
| 6,661,397 B2 | 12/2003 | Mikami et al. | |
| 6,670,637 B2 | 12/2003 | Yamazaki et al. | |
| 6,677,713 B1 | 1/2004 | Sung | |
| 6,680,577 B1 | 1/2004 | Inukai et al. | |
| 6,687,266 B1 | 2/2004 | Ma et al. | |
| 6,690,344 B1 | 2/2004 | Takeuchi et al. | |
| 6,693,388 B2 | 2/2004 | Oomura | |
| 6,693,610 B2 | 2/2004 | Shannon et al. | 345/76 |
| 6,697,057 B2 | 2/2004 | Koyama et al. | 345/204 |
| 6,720,942 B2 | 4/2004 | Lee et al. | |
| 6,734,636 B2 | 5/2004 | Sanford et al. | 315/169.3 |
| 6,738,034 B2 | 5/2004 | Kaneko et al. | |
| 6,738,035 B1 | 5/2004 | Fan | |
| 6,771,028 B1 | 8/2004 | Winters | |
| 6,777,712 B2 | 8/2004 | Sanford et al. | |
| 6,780,687 B2 | 8/2004 | Nakajima et al. | |
| 6,806,638 B2 | 10/2004 | Lin et al. | |
| 6,806,857 B2 | 10/2004 | Sempel et al. | |
| 6,809,706 B2 | 10/2004 | Shimoda | |
| 6,859,193 B1 | 2/2005 | Yumoto | 345/82 |
| 6,861,670 B1 | 3/2005 | Ohtani et al. | |
| 6,873,117 B2 | 3/2005 | Ishizuka | |
| 6,873,320 B2 | 3/2005 | Nakamura | |
| 6,878,968 B1 | 4/2005 | Ohnuma | |
| 6,909,114 B1 | 6/2005 | Yamazaki | |
| 6,909,419 B2 | 6/2005 | Zavracky et al. | |
| 6,919,871 B2 | 7/2005 | Kwon | 345/92 |
| 6,937,215 B2 | 8/2005 | Lo | |
| 6,940,214 B1 | 9/2005 | Komiya et al. | 313/51 |
| 6,943,500 B2 | 9/2005 | LeChevalier | |
| 6,956,547 B2 | 10/2005 | Bae et al. | |
| 6,995,510 B2 | 2/2006 | Murakami et al. | |
| 6,995,519 B2 | 2/2006 | Arnold et al. | |
| 7,022,556 B1 | 4/2006 | Adachi | |
| 7,023,408 B2 | 4/2006 | Chen et al. | |
| 7,027,015 B2 | 4/2006 | Booth, Jr. et al. | |
| 7,034,793 B2 | 4/2006 | Sekiya et al. | |
| 7,088,051 B1 | 8/2006 | Cok | |
| 7,106,285 B2 | 9/2006 | Naugler | |
| 7,116,058 B2 | 10/2006 | Lo et al. | |
| 7,129,914 B2 | 10/2006 | Knapp et al. | 345/76 |
| 7,129,917 B2 | 10/2006 | Yamazaki et al. | |
| 7,141,821 B1 | 11/2006 | Yamazaki et al. | |
| 7,193,589 B2 | 3/2007 | Yoshida et al. | |
| 7,199,516 B2 | 4/2007 | Seo et al. | |
| 7,220,997 B2 | 5/2007 | Nakata | |
| 7,235,810 B1 | 6/2007 | Yamazaki et al. | |
| 7,245,277 B2 | 7/2007 | Ishizuka | |
| 7,248,236 B2 | 7/2007 | Nathan et al. | 345/76 |
| 7,264,979 B2 | 9/2007 | Yamagata et al. | |
| 7,274,345 B2 | 9/2007 | Imamura et al. | |
| 7,274,363 B2 | 9/2007 | Ishizuka et al. | |
| 7,279,711 B1 | 10/2007 | Yamazaki et al. | |
| 7,310,092 B2 | 12/2007 | Imamura | 245/204 |
| 7,315,295 B2 | 1/2008 | Kimura | |
| 7,319,465 B2 | 1/2008 | Mikami et al. | |
| 7,321,348 B2 | 1/2008 | Cok et al. | |
| 7,339,636 B2 | 3/2008 | Voloschenko et al. | |
| 7,355,574 B1 | 4/2008 | Leon et al. | |
| 7,358,941 B2 | 4/2008 | Ono et al. | |
| 7,402,467 B1 | 7/2008 | Kadono et al. | |
| 7,432,885 B2 | 10/2008 | Asano et al. | |
| 7,474,285 B2 | 1/2009 | Kimura | |
| 7,485,478 B2 | 2/2009 | Yamagata et al. | |
| 7,502,000 B2 | 3/2009 | Yuki et al. | |
| 7,535,449 B2 | 5/2009 | Miyazawa | |
| 7,554,512 B2 | 6/2009 | Steer | |
| 7,619,594 B2 | 11/2009 | Hu | |
| 7,619,597 B2 | 11/2009 | Nathan et al. | |
| 7,697,052 B1 | 4/2010 | Yamazaki et al. | |
| 7,825,419 B2 | 11/2010 | Yamagata et al. | |
| 7,859,492 B2 | 12/2010 | Kohno | |
| 7,868,859 B2 | 1/2011 | Tomida et al. | |
| 7,876,294 B2 | 1/2011 | Sasaki et al. | |
| 7,948,170 B2 | 5/2011 | Striakhilev et al. | |
| 7,969,390 B2 | 6/2011 | Yoshida | |
| 7,995,010 B2 | 8/2011 | Yamazaki et al. | |
| 8,044,893 B2 | 10/2011 | Nathan et al. | |
| 8,493,295 B2 | 7/2013 | Yamazaki et al. | |
| 8,497,525 B2 | 7/2013 | Yamagata et al. | |

(56) References Cited

U.S. PATENT DOCUMENTS

| | | | |
|---|---|---|---|
| 2001/0002703 A1 | 6/2001 | Koyama | 257/40 |
| 2001/0004190 A1 | 6/2001 | Nishi et al. | |
| 2001/0020926 A1 | 9/2001 | Kuijk | |
| 2001/0026127 A1 | 10/2001 | Yoneda et al. | |
| 2001/0026179 A1 | 10/2001 | Saeki | |
| 2001/0026257 A1 | 10/2001 | Kimura | 345/87 |
| 2001/0030323 A1 | 10/2001 | Ikeda | 257/59 |
| 2001/0038098 A1 | 11/2001 | Yamazaki et al. | |
| 2001/0043173 A1 | 11/2001 | Troutman | 345/82 |
| 2001/0045929 A1 | 11/2001 | Prache et al. | 345/89 |
| 2001/0052606 A1 | 12/2001 | Sempel et al. | |
| 2001/0052898 A1 | 12/2001 | Osame et al. | |
| 2002/0000576 A1 | 1/2002 | Inukai | 257/202 |
| 2002/0011796 A1 | 1/2002 | Koyama | 315/169.1 |
| 2002/0011799 A1 | 1/2002 | Kimura | 315/169.3 |
| 2002/0011981 A1 | 1/2002 | Kuijk | |
| 2002/0015031 A1 | 2/2002 | Fujita et al. | |
| 2002/0015032 A1 | 2/2002 | Koyama et al. | |
| 2002/0030528 A1 | 3/2002 | Matsumoto et al. | |
| 2002/0030647 A1 | 3/2002 | Hack et al. | |
| 2002/0036463 A1 | 3/2002 | Yoneda et al. | |
| 2002/0047852 A1 | 4/2002 | Inukai et al. | |
| 2002/0048829 A1 | 4/2002 | Yamazaki et al. | |
| 2002/0050795 A1 | 5/2002 | Imura | |
| 2002/0070909 A1 | 6/2002 | Asano et al. | |
| 2002/0080108 A1 | 6/2002 | Wang | |
| 2002/0084463 A1 | 7/2002 | Sanford et al. | |
| 2002/0101172 A1 | 8/2002 | Bu | |
| 2002/0101433 A1 | 8/2002 | McKnight | |
| 2002/0113248 A1 | 8/2002 | Yamagata et al. | |
| 2002/0122308 A1 | 9/2002 | Ikeda | |
| 2002/0130686 A1 | 9/2002 | Forbes | |
| 2002/0154084 A1 | 10/2002 | Tanaka et al. | |
| 2002/0158823 A1 | 10/2002 | Zavracky et al. | |
| 2002/0163314 A1 | 11/2002 | Yamazaki et al. | |
| 2002/0180369 A1 | 12/2002 | Koyama | |
| 2002/0180721 A1 | 12/2002 | Kimura et al. | |
| 2002/0186214 A1 | 12/2002 | Siwinski | |
| 2002/0190332 A1 | 12/2002 | Lee et al. | |
| 2002/0190924 A1 | 12/2002 | Asano et al. | |
| 2002/0190971 A1 | 12/2002 | Nakamura et al. | |
| 2002/0195967 A1 | 12/2002 | Kim et al. | |
| 2002/0195968 A1 | 12/2002 | Sanford et al. | 315/169.3 |
| 2003/0020413 A1 | 1/2003 | Oomura | |
| 2003/0030603 A1 | 2/2003 | Shimoda | |
| 2003/0062524 A1 | 4/2003 | Kimura | 257/72 |
| 2003/0063081 A1 | 4/2003 | Kimura et al. | |
| 2003/0076048 A1 | 4/2003 | Rutherford | |
| 2003/0090445 A1 | 5/2003 | Chen et al. | |
| 2003/0090447 A1 | 5/2003 | Kimura | |
| 2003/0090481 A1 | 5/2003 | Kimura | 345/211 |
| 2003/0095087 A1 | 5/2003 | Libsch et al. | |
| 2003/0107560 A1 | 6/2003 | Yumoto et al. | 345/204 |
| 2003/0111966 A1 | 6/2003 | Mikami et al. | 315/169.3 |
| 2003/0122745 A1 | 7/2003 | Miyazawa | |
| 2003/0140958 A1 | 7/2003 | Yang et al. | |
| 2003/0151569 A1 | 8/2003 | Lee et al. | |
| 2003/0169219 A1 | 9/2003 | LeChevalier | |
| 2003/0174152 A1 | 9/2003 | Noguchi | |
| 2003/0179626 A1 | 9/2003 | Sanford et al. | |
| 2003/0197663 A1 | 10/2003 | Lee et al. | |
| 2003/0230980 A1 | 12/2003 | Forrest et al. | 313/600 |
| 2004/0027063 A1 | 2/2004 | Nishikawa | |
| 2004/0056604 A1 | 3/2004 | Shih et al. | |
| 2004/0066357 A1 | 4/2004 | Kawasaki | |
| 2004/0070557 A1 | 4/2004 | Asano et al. | 345/76 |
| 2004/0080262 A1 | 4/2004 | Park et al. | |
| 2004/0080470 A1 | 4/2004 | Yamazaki et al. | |
| 2004/0090400 A1 | 5/2004 | Yoo | |
| 2004/0113903 A1 | 6/2004 | Mikami et al. | |
| 2004/0129933 A1 | 7/2004 | Nathan et al. | |
| 2004/0130516 A1 | 7/2004 | Nathan et al. | |
| 2004/0135749 A1 | 7/2004 | Kondakov et al. | |
| 2004/0145547 A1 | 7/2004 | Oh | 345/76 |
| 2004/0150592 A1 | 8/2004 | Mizukoshi et al. | |
| 2004/0150594 A1 | 8/2004 | Koyama et al. | |
| 2004/0150595 A1 | 8/2004 | Kasai | 345/82 |
| 2004/0155841 A1 | 8/2004 | Kasai | 345/76 |
| 2004/0174347 A1 | 9/2004 | Sun et al. | |
| 2004/0174349 A1 | 9/2004 | Libsch et al. | |
| 2004/0183759 A1 | 9/2004 | Stevenson et al. | |
| 2004/0189627 A1 | 9/2004 | Shirasaki et al. | |
| 2004/0196275 A1 | 10/2004 | Hattori | 345/204 |
| 2004/0201554 A1 | 10/2004 | Satoh | |
| 2004/0207615 A1 | 10/2004 | Yumoto | |
| 2004/0239596 A1 | 12/2004 | Ono et al. | |
| 2004/0252089 A1 | 12/2004 | Ono et al. | 345/82 |
| 2004/0257355 A1 | 12/2004 | Naugler | |
| 2004/0263437 A1 | 12/2004 | Hattori | |
| 2005/0007357 A1 | 1/2005 | Yamashita et al. | 345/204 |
| 2005/0035709 A1 | 2/2005 | Furuie et al. | |
| 2005/0067970 A1 | 3/2005 | Libsch et al. | |
| 2005/0067971 A1 | 3/2005 | Kane | 315/169.3 |
| 2005/0068270 A1 | 3/2005 | Awakura | |
| 2005/0088103 A1 | 4/2005 | Kageyama et al. | |
| 2005/0110420 A1 | 5/2005 | Arnold et al. | |
| 2005/0117096 A1 | 6/2005 | Voloschenko et al. | |
| 2005/0140598 A1 | 6/2005 | Kim et al. | |
| 2005/0140610 A1 | 6/2005 | Smith et al. | |
| 2005/0145891 A1 | 7/2005 | Abe | |
| 2005/0156831 A1 | 7/2005 | Yamazaki et al. | |
| 2005/0168416 A1 | 8/2005 | Hashimoto et al. | |
| 2005/0206590 A1 | 9/2005 | Sasaki et al. | |
| 2005/0225686 A1 | 10/2005 | Brummack et al. | |
| 2005/0260777 A1 | 11/2005 | Brabec et al. | |
| 2005/0269959 A1 | 12/2005 | Uchino et al. | |
| 2005/0269960 A1 | 12/2005 | Ono et al. | |
| 2005/0285822 A1 | 12/2005 | Reddy et al. | |
| 2005/0285825 A1 | 12/2005 | Eom et al. | 345/76 |
| 2006/0007072 A1 | 1/2006 | Choi et al. | |
| 2006/0012310 A1 | 1/2006 | Chen et al. | |
| 2006/0027807 A1 | 2/2006 | Nathan et al. | |
| 2006/0030084 A1 | 2/2006 | Young | |
| 2006/0038758 A1 | 2/2006 | Routley et al. | |
| 2006/0066527 A1 | 3/2006 | Chou | |
| 2006/0092185 A1 | 5/2006 | Jo et al. | |
| 2006/0232522 A1 | 10/2006 | Roy et al. | |
| 2006/0261841 A1 | 11/2006 | Fish | 324/770 |
| 2006/0264143 A1 | 11/2006 | Lee et al. | |
| 2006/0273997 A1 | 12/2006 | Nathan et al. | |
| 2006/0284801 A1 | 12/2006 | Yoon et al. | |
| 2007/0001937 A1 | 1/2007 | Park et al. | |
| 2007/0001939 A1 | 1/2007 | Hashimoto et al. | |
| 2007/0008268 A1 | 1/2007 | Park et al. | |
| 2007/0069998 A1 | 3/2007 | Naugler et al. | |
| 2007/0080905 A1 | 4/2007 | Takahara | |
| 2007/0080906 A1 | 4/2007 | Tanabe | |
| 2007/0080908 A1 | 4/2007 | Nathan et al. | |
| 2007/0080918 A1 | 4/2007 | Kawachi et al. | |
| 2007/0103419 A1 | 5/2007 | Uchino et al. | |
| 2007/0182671 A1 | 8/2007 | Nathan et al. | |
| 2007/0273294 A1 | 11/2007 | Nagayama | |
| 2007/0285359 A1 | 12/2007 | Ono | |
| 2007/0296672 A1 | 12/2007 | Kim et al. | |
| 2008/0042948 A1 | 2/2008 | Yamashita et al. | |
| 2008/0055209 A1 | 3/2008 | Cok | |
| 2008/0074413 A1 | 3/2008 | Ogura | |
| 2008/0088549 A1 | 4/2008 | Nathan et al. | |
| 2009/0160743 A1 | 6/2009 | Tomida et al. | |
| 2009/0213046 A1 | 8/2009 | Nam | |
| 2010/0079711 A1 | 4/2010 | Tanaka | |
| 2010/0328294 A1 | 12/2010 | Sasaki et al. | |
| 2011/0090210 A1 | 4/2011 | Sasaki et al. | |

FOREIGN PATENT DOCUMENTS

| | | | |
|---|---|---|---|
| CA | 2249592 | 7/1998 | G09G 3/30 |
| CA | 2368386 | 9/1999 | G09G 3/32 |
| CA | 2242720 | 5/2000 | H02J 1/04 |
| CA | 2354018 | 6/2000 | G09G 3/36 |
| CA | 2 438 577 | 8/2002 | |
| CA | 2436451 | 8/2002 | G02F 1/133 |

(56) References Cited

FOREIGN PATENT DOCUMENTS

| | | | |
|---|---|---|---|
| CA | 2 483 645 | 12/2003 | |
| CA | 2463653 | 1/2004 | ............... G09G 5/00 |
| CA | 2498136 | 3/2004 | |
| CA | 2522396 | 11/2004 | |
| CA | 2443206 | 3/2005 | |
| CA | 2472671 | 12/2005 | |
| CA | 2567076 | 1/2006 | |
| CA | 2526782 | 4/2006 | |
| CN | 1381032 | 11/2002 | |
| DE | 20 2006 005427 | 6/2006 | |
| EP | 0 940 796 | 9/1999 | |
| EP | 1028471 | 8/2000 | ................ G09F 9/30 |
| EP | 1 103 947 | 5/2001 | |
| EP | 1130565 | 9/2001 | ............... G09G 3/32 |
| EP | 1 184 833 | 3/2002 | |
| EP | 1 194 013 | 3/2002 | |
| EP | 1 310 939 | 5/2003 | |
| EP | 1310939 | 5/2003 | ............... G09G 3/32 |
| EP | 1 335 430 A1 | 8/2003 | |
| EP | 1 372 136 | 12/2003 | |
| EP | 1 381 019 | 1/2004 | |
| EP | 1 418 566 | 5/2004 | |
| EP | 1429312 | 6/2004 | ............... G09G 3/20 |
| EP | 1 439 520 | 7/2004 | |
| EP | 1 467 408 | 10/2004 | |
| EP | 1465143 | 10/2004 | ............... G09G 3/14 |
| EP | 1 517 290 | 3/2005 | |
| EP | 1 521 203 A2 | 4/2005 | |
| GB | 2 205 431 | 12/1988 | |
| JP | 9-090405 | 4/1997 | ............... G02F 1/136 |
| JP | 10-153759 | 6/1998 | |
| JP | 10-254410 | 9/1998 | |
| JP | 11-231805 | 8/1999 | ................ G09F 9/30 |
| JP | 11-282419 | 10/1999 | |
| JP | 11-354802 | 12/1999 | ............... G02F 1/136 |
| JP | 2000/056847 | 2/2000 | |
| JP | 2000-089198 | 3/2000 | |
| JP | 2000-352941 | 12/2000 | |
| JP | 2002-91376 | 3/2002 | |
| JP | 2002-268576 | 9/2002 | |
| JP | 2002-278513 | 9/2002 | |
| JP | 2002-333862 | 11/2002 | |
| JP | 2003-022035 | 1/2003 | |
| JP | 2003-076331 | 3/2003 | |
| JP | 2003-150082 | 5/2003 | |
| JP | 2003177709 | 6/2003 | |
| JP | 2003-271095 | 9/2003 | |
| JP | 2003/308046 | 10/2003 | |
| JP | 2005-057217 | 6/2005 | |
| TW | 485337 | 5/2002 | |
| TW | 502233 | 9/2002 | |
| TW | 538650 | 6/2003 | |
| TW | 569173 | 1/2004 | |
| WO | WO 94/25954 | 11/1994 | |
| WO | WO 9948079 | 9/1999 | |
| WO | WO 01/06484 | 1/2001 | |
| WO | WO 01/27910 A1 | 4/2001 | |
| WO | WO 03/063124 | 3/2002 | |
| WO | 2002/067327 | 8/2002 | ................ G09F 9/30 |
| WO | WO 03/034389 A | 4/2003 | |
| WO | WO 03/077231 | 9/2003 | |
| WO | WO 03/105117 | 12/2003 | |
| WO | WO 2004/003877 | 1/2004 | |
| WO | WO 2004/034364 | 4/2004 | |
| WO | WO 2005/022498 | 3/2005 | |
| WO | WO 2005/029455 | 3/2005 | |
| WO | WO 2005/055185 | 6/2005 | |
| WO | 2006/053424 | 5/2006 | ................ G09F 9/33 |
| WO | WO 2006/063448 A | 6/2006 | |
| WO | WO 2006/137337 | 12/2006 | |
| WO | WO 2007/003877 A | 1/2007 | |
| WO | WO 2007/079572 | 7/2007 | |
| WO | WO 2010/023270 | 3/2010 | |

OTHER PUBLICATIONS

Goh et al., "A New a-Si:H Thin Film Transistor Pixel Circul for Active-Matrix Organic Light-Emitting Diodes", IEEE Electron Device Letters, vol. 24, No. 9, Sep. 2003, 3 pages.

Nathan et al.: "Invited Paper: a -Si for AMOLED—Meeting the Performance and Cost Demands of Display Applications (Cell Phone to HDTV)", dated 2006 (4 pages).

Nathan, et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.

Office Action issued in Chinese Patent Application 200910246264.4 Dated Jul. 5, 2013; 8 pages.

Patent Abstracts of Japan, vol. 2000, No. 09, Oct. 13, 2000—JP 2000 172199 A, Jun. 3, 2000, abstract.

Patent Abstracts of Japan, vol. 2002, No. 03, Apr. 3, 2002 (Apr. 4, 2004 & JP 2001 318627 A (Semiconductor EnergyLab DO LTD), Nov. 16, 2001, abstract, paragraphs '01331-01801, paragraph '01691, paragraph '01701, paragraph '01721 and figure 10.

Sanford, James L., et al., "4.2 TFT AMOLED Pixel Circuits and Driving Methods", SID 03 Digest, ISSN/0003, 2003, pp. 10-13.

Tatsuya Sasaoka et al., 24.4L; Late-News Paper: A 13.0-inch AM-Oled Display with Top Emitting Structure and Adaptive Current Mode Programmed Pixel Circuit (TAC), SID 01 Digest, (2001), pp. 384-387.

Written Opinion mailed Jul. 30, 2009 for International Application No. PCT/CA2009/000501 (6 pages).

Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.

Zhiguo Meng et al; "24.3: Active-Matrix Organic Light-Emitting Diode Display implemented Using Metal-Induced Unilaterally Crystallized Polycrystalline Silicon Thin-Film Transistors", SID 01 Digest, (2001), pp. 380-383.

European Search Report mailed Mar. 26, 2012 which issued in corresponding European Patent Application No. 10000421.7 (6 pages).

Ahnood et al.: "Effect of threshold voltage instability on field effect mobility in thin film transistors deduced from constant current measurements"; dated Aug. 2009 (3 pages).

Alexander et al.: "Pixel circuits and drive schemes for glass and elastic AMOLED displays"; dated Jul. 2005 (9 pages).

Alexander et al.: "Unique Electrical Measurement Technology for Compensation, Inspection, and Process Diagnostics of AMOLED HDTV"; dated May 2010 (4 pages).

Ashtiani et al.: "AMOLED Pixel Circuit With Electronic Compensation of Luminance Degradation"; dated Mar. 2007 (4 pages).

Chaji et al.: "A Current-Mode Comparator for Digital Calibration of Amorphous Silicon AMOLED Displays"; dated Jul. 2008 (5 pages).

Chaji et al.: "A fast settling current driver based on the CCII for AMOLED displays"; dated Dec. 2009 (6 pages).

Chaji et al.: "A Low-Cost Stable Amorphous Silicon AMOLED Display with Full V~T- and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

Chaji et al.: "A novel a-Si:H AMOLED pixel circuit based on short-term stress stability of a-Si:H TFTs"; dated Oct. 2005 (3 pages).

Chaji et al.: "A Novel Driving Scheme and Pixel Circuit for AMOLED Displays"; dated Jun. 2006 (4 pages).

Chaji et al.: "A novel driving scheme for high-resolution large-area a-Si:H AMOLED displays"; dated Aug. 2005 (4 pages).

Chaji et al.: "A Stable Voltage-Programmed Pixel Circuit for a-Si:H AMOLED Displays"; dated Dec. 2006 (12 pages).

Chaji et al.: "A Sub-μA fast-settling current-programmed pixel circuit for AMOLED displays"; dated Sep. 2007 (4 pages).

Chaji et al.: "An Enhanced and Simplified Optical Feedback Pixel Circuit for AMOLED Displays"; dated Oct. 2006 (2 pages).

(56) References Cited

OTHER PUBLICATIONS

Chaji et al.: "Compensation technique for DC and transient instability of thin film transistor circuits for large-area devices"; dated Aug. 2008 (9 pages).

Chaji et al.: "Driving scheme for stable operation of 2-TFT a-Si AMOLED pixel"; dated Apr. 2005 (2 pages).

Chaji et al.: "Dynamic-effect compensating technique for stable a-Si:H AMOLED displays"; dated Aug. 2005 (4 pages).

Chaji et al.: "Electrical Compensation of OLED Luminance Degradation"; dated Dec. 2007 (3 pages).

Chaji et al.: "eUTDSP: a design study of a new VLIW-based DSP architecture"; dated My 2003 (4 pages).

Chaji et al.: "Fast and Offset-Leakage Insensitive Current-Mode Line Driver for Active Matrix Displays and Sensors"; dated Feb. 2009 (8 pages).

Chaji et al.: "High Speed Low Power Adder Design With a New Logic Style: Pseudo Dynamic Logic (SDL)"; dated Oct. 2001 (4 pages).

Chaji et al.: "High-precision, fast current source for large-area current-programmed a-Si flat panels"; dated Sep. 2006 (4 pages).

Chaji et al.: "Low-Cost AMOLED Television with IGNIS Compensating Technology"; dated May 2008 (4 pages).

Chaji et al.: "Low-Cost Stable a-Si:H AMOLED Display for Portable Applications"; dated Jun. 2006 (4 pages).

Chaji et al.: "Low-Power Low-Cost Voltage-Programmed a-Si:H AMOLED Display"; dated Jun. 2008 (5 pages).

Chaji et al.: "Merged phototransistor pixel with enhanced near infrared response and flicker noise reduction for biomolecular imaging"; dated Nov. 2008 (3 pages).

Chaji et al.: "Parallel Addressing Scheme for Voltage-Programmed Active-Matrix OLED Displays"; dated May 2007 (6 pages).

Chaji et al.: "Pseudo dynamic logic (SDL): a high-speed and low-power dynamic logic family"; dated 2002 (4 pages).

Chaji et al.: "Stable a-Si:H circuits based on short-term stress stability of amorphous silicon thin film transistors"; dated May 2006 (4 pages).

Chaji et al.: "Stable Pixel Circuit for Small-Area High-Resolution a-Si:H AMOLED Displays"; dated Oct. 2008 (6 pages).

Chaji et al.: "Stable RGBW AMOLED display with OLED degradation compensation using electrical feedback"; dated Feb. 2010 (2 pages).

Chaji et al.: "Thin-Film Transistor Integration for Biomedical Imaging and AMOLED Displays"; dated 2008 (177 pages).

European Search Report for European Application No. EP 04 78 6661 dated Mar. 9, 2009.

International Search Report for International Application No. PCT/CA2004/001741 dated Feb. 21, 2005.

Jafarabadiashtiani et al.: "A New Driving Method for a-Si AMOLED Displays Based on Voltage Feedback"; dated 2005 (4 pages).

Lee et al.: "Ambipolar Thin-Film Transistors Fabricated by PECVD Nanocrystalline Silicon"; dated 2006 (6 pages).

Ma E Y et al: "Organic Light-Emitting Diode/Thin Film Transistor Integration for Foldable Displays" Conference Record of the 1997 International Display Research Conference and International Workshops on LCD Technology and Emissive Technology. Toronto, Sept. 15-19, 1997, International Display Research Conference (IDRC), Santa Ana, CA, SID, US, vol. CONF. 17, Sep. 15, 1997, pp. 78-81, XP000931235 p. L-78, col. 2, last paragraph-p. L-80, col. 1, paragraph 1.

Matsueda y et al.: "35.1: 2.5-in. AMOLED with Integrated 6-bit Gamma Compensated Digital Data Driver"; dated May 2004.

Nathan et al.: "Backplane Requirements for Active Matrix Organic Light Emitting Diode Displays"; dated 2006 (16 pages).

Nathan et al.: "Call for papers second international workshop on compact thin-film transistor (TFT) modeling for circuit simulation"; dated Sep. 2009 (1 page).

Nathan et al.: "Driving schemes for a-Si and LTPS AMOLED displays"; dated Dec. 2005 (11 pages).

Nathan et al.: "Invited Paper: a -Si for AMOLED—Meeting the Performance and Cost Demands of Display Applications (Cell Phone to HDTV)"; dated 2006 (4 pages).

Nathan et al.: "Thin Film Imaging Technology on Glass and Plastic." ICM 2000. Proceedings of the $12^{th}$ International Conference on Microelectronics. (IEEE Cat. No. 00EX453), ICM 2000. Proceedings of the $12^{th}$ International Conference on Microelectronics, Tehran, Iran, Oct. 31-Nov. 2, 2000, pp. 11-14, XP002206242 2000, Tehran, Iran, Univ. Tehran, Iran, ISBN: 964-360-057-2, p. 13, col. 1, line 11.48.

Philipp: "Charge transfer sensing" SENSOR REVIEW, vol. 19, No. 2, Dec. 31, 1999, 10 pages.

Rafati et al.: "Comparison of a 17 b multiplier in Dual-rail domino and in Dual-rail D L (D L) logic styles"; dated 2002 (4 pages).

Safavaian et al.: "Three-TFT image sensor for real-time digital X-ray imaging"; dated Feb. 2, 2006 (2 pages).

Safavian et al.: "3-TFT active pixel sensor with correlated double sampling readout circuit for real-time medical x-ray imaging"; dated Jun. 2006 (4 pages).

Safavian et al.: "A novel current scaling active pixel sensor with correlated double sampling readout circuit for real time medical x-ray imaging"; dated May 2007 (7 pages).

Safavian et al.: "A novel hybrid active-passive pixel with correlated double sampling CMOS readout circuit for medical x-ray imaging"; dated May 2008 (4 pages).

Safavian et al.: "Self-compensated a-Si:H detector with current-mode readout circuit for digital X-ray fluoroscopy"; dated Aug. 2005 (4 pages).

Safavian et al.: "TFT active image sensor with current-mode readout circuit for digital x-ray fluoroscopy [5969D-82]"; dated Sep. 2005 (9 pages).

Stewart M. et al. "Polysilicon TFT Technology for Active Matrix OLED Displays" IEEE Transactions on Electron Devices, vol. 48, No. 5, pp. 845-854, May 5, 2001.

Vygranenko et al.: "Stability of indium-oxide thin-film transistors by reactive ion beam assisted deposition"; dated 2009.

Wang et al.: "Indium oxides by reactive ion beam assisted evaporation: From material study to device application"; dated Mar. 2009 (6 pages).

US 8,664,644 B2

PIXEL DRIVER CIRCUIT AND PIXEL CIRCUIT HAVING THE PIXEL DRIVER CIRCUIT

CROSS REFERENCE TO RELATED APPLICATIONS

This application is a continuation of U.S. patent application Ser. No. 12/504,510, filed Jul. 16, 2009, which is a continuation of U.S. patent application Ser. No. 11/220,094, filed Sep. 6, 2005, now U.S. Pat. No. 7,569,849, issued Aug. 4, 2009, which is a continuation-in-part of U.S. patent application Ser. No. 10/468,319, filed Jan. 23, 2004, which is the U.S. National Phase of PCT/CA02/00173, filed Feb. 18, 2002, which claims the benefit of U.S. Provisional Application 60/268,900, filed Feb. 16, 2001, all of which are incorporated herein by reference in their entireties.

FIELD OF INVENTION

The present invention relates to a display technology, and more particularly to a pixel driver circuit for driving a light-emitting element and a pixel circuit having the pixel driver circuit.

BACKGROUND OF THE INVENTION

Organic light emitting diode (OLED) displays have gained significant interest recently in display applications in view of their faster response times, larger viewing angles, higher contrast, lighter weight, lower power, amenability to flexible substrates, as compared to liquid crystal displays (LCDs). Despite the OLED's demonstrated superiority over the LCD, there still remain several challenging issues related to encapsulation and lifetime, yield, color efficiency, and drive electronics, all of which are receiving considerable attention.

Although passive matrix addressed OLED displays are already in the marketplace, they do not support the resolution needed in the next generation displays, since high information content (HIC) formats are only possible with the active matrix addressing scheme.

Active matrix addressing involves a layer of backplane electronics, based on thin film transistors (TFTs) fabricated using amorphous silicon (a-Si:H), polycrystalline silicon (poly-Si), or polymer technologies, to provide the bias voltage and drive current needed in each OLED based pixel. Here, the voltage on each pixel is lower and the current throughout the entire frame period is a low constant value, thus avoiding the excessive peak driving and leakage currents associated with passive matrix addressing. This in turn increases the lifetime of the OLED.

In active matrix OLED (AMOLED) displays, it is important to ensure that the aperture ratio or fill factor (defined as the ratio of light emitting display area to the total pixel area) should be high enough to ensure display quality.

Conventional AMOLED displays are based on light emission through an aperture on the glass substrate where the backplane electronics is integrated. Increasing the on-pixel density of TFT integration for stable drive current reduces the size of the aperture. The same happens when pixel sizes are scaled down. One solution to having an aperture ratio that is invariant on scaling or on-pixel integration density is to vertically stack the OLED layer on the backplane electronics, along with a transparent top electrode as shown in FIG. 2. In FIG. 2, reference numerals S and D denote a source and a drain, respectively. This implies a continuous back electrode over the OLED pixel.

However, this continuous back electrode can give rise to parasitic capacitance, whose effects become significant when the electrode runs over the switching and other TFTs. The presence of the back electrode can induce a parasitic channel in TFTs giving rise to high leakage current. The leakage current is the current that flows between source and drain of the TFT when the gate of the TFT is in its OFF state.

SUMMARY OF THE INVENTION

It is an object of the invention to provide a system that obviates or mitigates at least one of the disadvantages of existing systems.

The present invention relates to a pixel driver circuit for driving a light-emitting element (e.g. OLED), and a pixel circuit having the pixel driver circuit.

In accordance with an aspect of the present invention, there is provided a pixel driver circuit, which includes: an address line; a data line; a switch thin film transistor, a first node of the switch transistor being connected to the data line and a gate of the switch transistor being connected to the address line; a feedback thin film transistor, a first node of the feedback transistor being connected to the data line and a gate of the feedback transistor being connected to the address line; a reference thin film transistor, a drain of the reference transistor being connected to a second node of the feedback transistor, a gate of the reference transistor being connected to a second node of the switch transistor and a source of the reference transistor being connected to a ground potential; and a drive thin film transistor, a gate of the drive transistor being connected to the gate of the reference transistor.

In accordance with a further aspect of the present invention, there is provided a pixel circuit, which includes: the pixel driver circuit described above; and an organic light emitting diode, the source of the drive transistor being connected to the ground potential and the drain being connected to the organic light emitting diode.

In accordance with a further aspect of the present invention, there is provided a pixel driver circuit, which includes: an address line; a data line; a switch thin film transistor, a first node of the switch transistor being connected to the data line and a gate of the switch transistor being connected to the address line; a feedback thin film transistor, a gate of the feedback transistor being connected to the address line and a second node of the feedback transistor being connected to a ground potential; a reference thin film transistor, a drain of the reference transistor being connected to a second node of the switch transistor, a gate of the reference transistor being connected to the second node of the switch transistor and a source of the reference transistor being connected to a first node of the feedback transistor; and a drive thin film transistor, a gate of the drive transistor being connected to the gate of the reference transistor.

In accordance with a further aspect of the present invention, there is provided a pixel circuit, which includes: the pixel driver circuit described above; and an organic light emitting diode, the source of the drive transistor being connected to the ground potential and the drain being connected to the organic light emitting diode.

In accordance with a further aspect of the present invention, there is provided a pixel circuit, which includes: the pixel driver circuit described above; and an organic light emitting diode, the source of the drive transistor being connected to the organic light emitting diode and the drain being connected to a voltage supply.

In accordance with a further aspect of the present invention, there is provided a pixel driver circuit, which includes:

an address line; a data line; a switch thin film transistor, a first node of the switch transistor being connected to the data line and a gate of the switch transistor being connected to the address line; a feedback thin film transistor, a first node of the feedback transistor being connected to the data line and a gate of the feedback transistor being connected to the address line; a reference thin film transistor, a drain of the reference transistor being connected to a second node of the feedback transistor, the gate of the reference transistor being connected to a second node of the switch transistor and a source of the reference transistor being connected to a ground potential; a diode-use thin film transistor, a drain and a gate of the diode-use transistor being connected to a potential, and a source of the diode-use transistor being connected to the second node of the feedback transistor; and a drive thin film transistor, a gate of the drive transistor being connected to the gate of the reference transistor.

In accordance with a further aspect of the present invention, there is provided a pixel circuit, which includes: the pixel driver circuit described above; and an organic light emitting diode, the source of the drive transistor being connected to the ground potential and the drain being connected to the organic light emitting diode.

In accordance with a further aspect of the present invention, there is provided a pixel circuit, which includes: the pixel driver circuit described above; and an organic light emitting diode, the source of the drive transistor being connected to the organic light emitting diode, and the drain being connected to a voltage supply.

In accordance with a further aspect of the present invention, there is provided a pixel driver circuit for driving a colour pixel of a colour display, which includes: a first address line; a data line; a first switch thin film transistor, a first node of the first switch transistor being connected to the data line and a gate of the switch transistor being connected to the first address line; a feedback thin film transistor, a first node and a gate of the feedback transistor being connected to a second node of the first switch transistor and a second node of the feedback transistor being connected to a ground potential; a second switch thin film transistor, a source of the second switch transistor being connected to a second node of the first switch transistor, a gate of the second switch transistor being connected to a second address line; a first drive thin film transistor, a gate of the first drive transistor being connected to a drain of the second switch transistor; a third switch thin film transistor, a source of the third switch transistor being connected to the second node of the first switch transistor, a gate of the third switch transistor being connected to a third address line; a second drive thin film transistor, a gate, of the second drive transistor being connected to the drain of the third switch transistor; a fourth switch thin film transistor, a source of the fourth switch transistor being connected to the second node of the first switch transistor, a gate of the fourth switch transistor being connected to a fourth address line; and a third drive thin film transistor, a gate of the third drive transistor being connected to the drain of the fourth switch transistor.

In accordance with a further aspect of the present invention, there is provided a pixel circuit, which includes: the pixel driver circuit described above; a first organic light emitting diode, a source of the first drive transistor being connected to the ground potential and a drain of the first drive transistor being connected to the first organic light emitting diode; a second organic light emitting diode, a source of the second drive transistor being connected to the ground potential and a drain of the second drive transistor being connected to the second organic light emitting diode; and a third organic light emitting diode, a source of the third drive transistor being connected to the ground potential and a drain of the third drive transistor being connected to the third organic light emitting diode.

In accordance with a further aspect of the present invention, there is provided a pixel circuit which includes: a pixel driver circuit described above, a first organic light emitting diode associated with the first drive transistor; a second organic light emitting diode associated with the second drive transistor; and a third organic light emitting diode associated with the third drive transistor, the source of the first drive transistor being connected to the first organic light emitting diode, and a drain of the first drive transistor being connected to a voltage supply.

This summary of the invention does not necessarily describe all features of the invention.

BRIEF DESCRIPTION OF THE DRAWINGS

These and other features of the invention will become more apparent from the following description in which reference is made to the appended drawings wherein.

DETAILED DESCRIPTION

The following description is of a preferred embodiment.

The embodiments of the present invention are described using an OLED display. However, the embodiments of the present invention are applicable to any other displays, such as phosphorus displays, inorganic electroluminescent (EL), and LED displays. A pixel driver circuit in accordance with the embodiments of the present invention includes a plurality of TFTs, which form a current mirror based pixel current driver for automatically compensating for the shift of threshold $V_{th}$ of a drive TFT. The TFTs are formed in a current-programmed $\Delta V_T$-compensated manner.

The pixel driver circuit is suitable for an OLED display. The OLED layer may be vertically stacked on the plurality of TFTs. The pixel driver circuit may be provided for monochrome displays or for full colour displays. The OLED may be a regular (P-I-N) stack OLED or an inverted (N-I-P) stack OLED, and may be located at either the drain or source of the drive TFT(s)

The TFT may be an n-type TFT or a p-type TFT. The TFT may be, but not limited to, an amorphous silicon (a-Si:H) based TFT, a polysilicon-based TFT, a crystalline silicon based TFT, or an organic semiconductor based TFT.

Although amorphous Si does not enjoy equivalent electronic properties compared to poly-Si, it adequately meets many of the drive requirements for small area displays such as those used in pagers, cell phones, and other mobile devices. Poly-Si TFTs have one key advantage in that they are able to provide better pixel drive capability because of their higher mobility. Their higher mobility can be of the order of $\mu_{FE}$~100 cm$^2$/Vs. "$\mu_{FE}$" represents field effect mobility, which is typically used to evaluate how well a semiconductor can conduct. "Vs" is a unit where V stands for volt, and s stands for second. This makes poly-Si highly desirable for large area (e.g. laptop size) Video Graphics Array (VGA) and Super VGA (SVGA) displays. The lower mobility associated with a-Si:H TFTs ($\mu_{FE}$~1 cm$^2$/Vs) is not a limiting factor since the drive transistor in the pixel can be scaled up in area to provide the needed drive current. The OLED drive current density is typically 10 mA/cm$^2$ at 10V operation to provide a brightness of 100 cd/m$^2$, which is the required luminance for most displays. For example, with an a-Si:H TFT mobility of 0.5 cm$^2$/Vs and channel length of 25 µm, this drive current requirement translates into required pixel area of 300 µm$^2$, which adequately meets the requirements of pixel resolution and speed for some 3-inch monochrome display applications.

Figure 1:
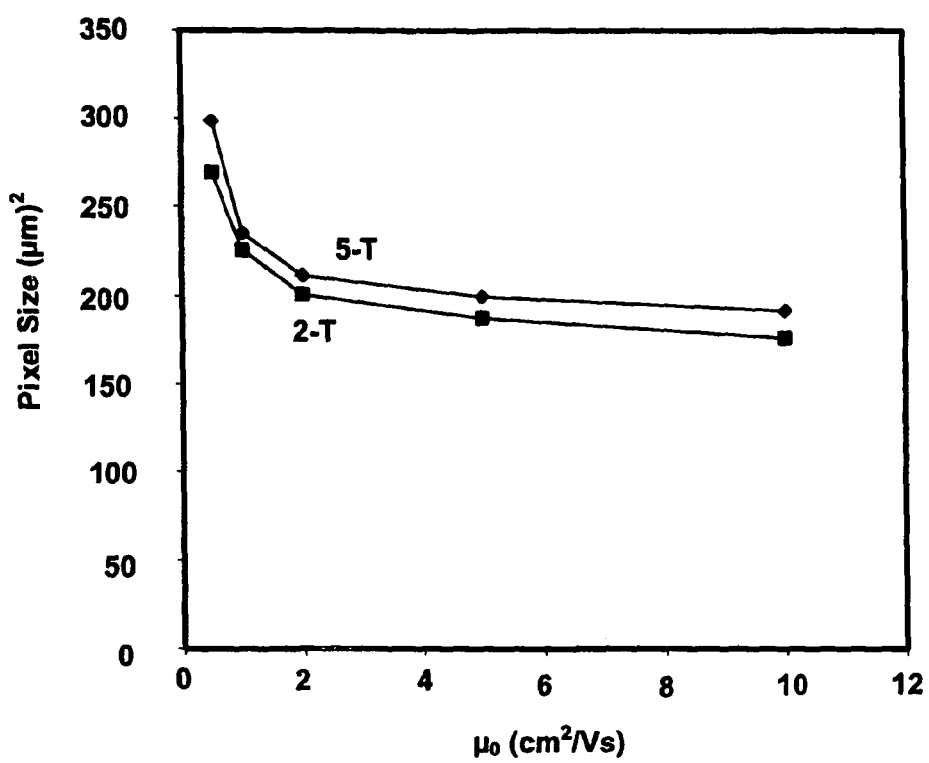
FIG. 1 shows variation of required pixel areas with mobility for 2-T and 5-T pixel drivers.
Figure 6A:
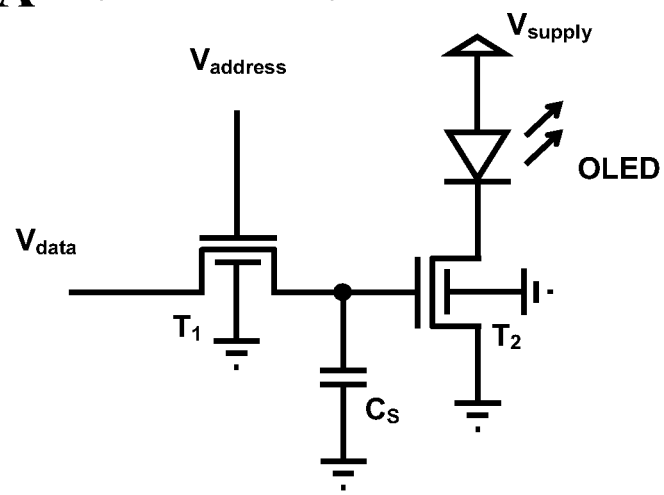
FIG. 6A shows a pixel circuit including a conventional 2-T pixel driver circuit.
Figure 7A:
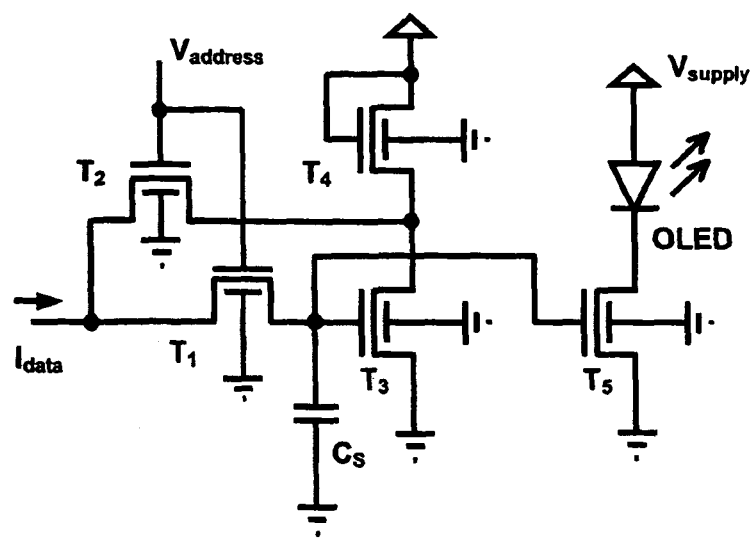
FIG. 7A shows a pixel circuit including a 5-T pixel current driver circuit for an OLED display in accordance with an embodiment of the present invention.

FIG. 1 illustrates simulation results for the variation of the required pixel size with device mobility calculated for two types of drivers, which will be elaborated later, a conventional voltage-programmed 2-T pixel driver circuit (FIG. 6A) and a current-programmed, $\Delta V_T$ compensated 5-T pixel driver circuit in accordance with an embodiment of the present invention (FIG. 7A)

In FIG. 1, the graph having a mark "■" represents the pixel size required by the 2T pixel driver circuit given a reference mobility of the TFT, and the graph having a mark "♦" represents the pixel size required by the 5T pixel driver circuit given a reference mobility of the TFT. In FIG. 1, "$\mu_0$" denotes a reference mobility whose value is in the range 0.1 to 1 cm$^2$/Vs.

For instance, the area of the pixel for the 2-T pixel driver (FIG. 6A) has the area of the switching transistors, the area of the drive transistor, and the area occupied by interconnects, bias lines, etc. In FIG. 1, the drive current and frame rate are kept constant at 10 µA and 50 Hz, respectively, for a 230×230 array. It is clear that there is no significant savings in area between the 2-T and 5-T pixel drivers but the savings are considerable with increasing mobility. This stems mainly from the reduction in the area of the drive transistor where there is a trade-off between $\mu_{FE}$ and TFT aspect ratio, W/L (Width/Length).

In terms of threshold voltage ($V_T$) uniformity and stability, both poly-Si and a-Si:H share the same concerns, although in comparison, the latter provides far better spatial uniformity but not stability ($\Delta V_T$). Thus the inter-pixel variation in the drive current can be a concern in both cases, although clever circuit design techniques can be employed to compensate for $\Delta V_T$ hence improving drive current uniformity. In terms of long-term reliability, it is not clear with poly-Si technology. Although there are already products based on a-Si:H technology for displays and imaging, the reliability issues associated with OLEDs may yet be different.

The fabrication processes associated with technology are standard and adapted from mainstream integrated circuit (IC) technology, but with capital equipment costs that are much lower. One of the main advantages of the a-Si:H technology is that it has become a low cost and well-established technology, while poly-Si has yet to reach the stage of manufacturability. The technology also holds great promise for futuristic applications since deposition of a-Si:H, a-SiN$_x$:H, and TFT arrays can be achieved at low temperatures (≤120° C.) thus making it amenable to plastic substrates, which is a critical requirement for mechanically flexible displays.

Figure 2:
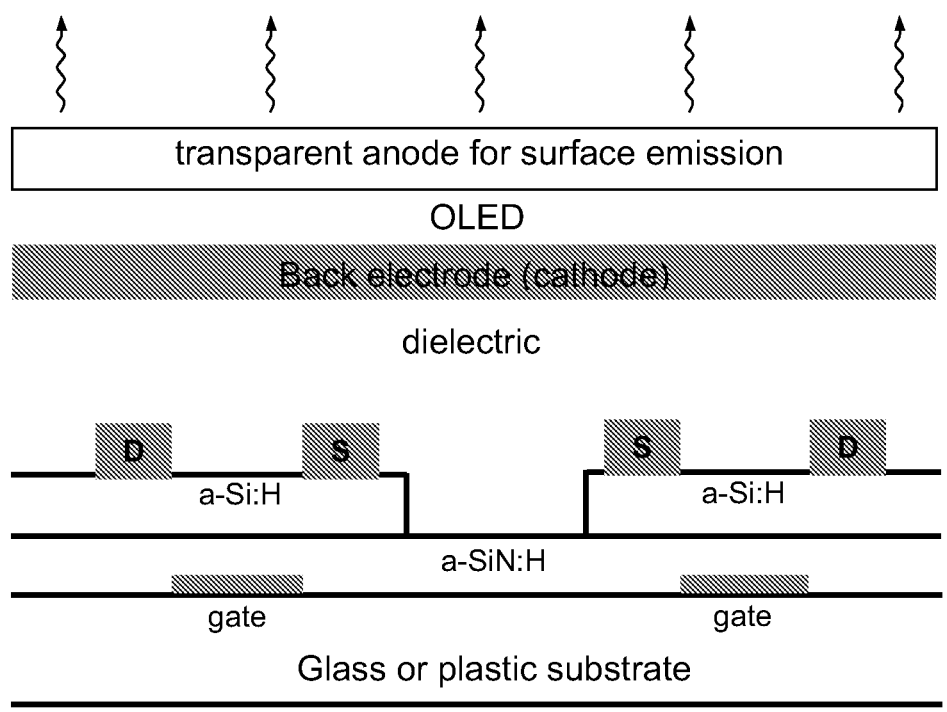
FIG. 2 shows a conventional pixel architecture for surface emissive a-Si:H AMOLED displays.

To minimize the conduction induced in all TFTs in the pixel by the back electrode, an alternate TFT structure based on a dual-gate structure is employed as shown in FIG. 7A. In the dual gate TFT (e.g. FIG. 3), a top gate electrode is added to the TFT structure to prevent the OLED electrodes from biasing the a-Si:H channel area (FIG. 2). The voltage on the top gate can be chosen such so as to minimize the charge induced in the (parasitic) top channel of the TFT. The objective underlying the choice of the voltage on the top gate is to minimize parasitic capacitance in the driver circuits and leakage currents in the TFTs so as to enhance circuit performance. In what follows, the operation of the dual-gate TFT is described.

Figure 3:
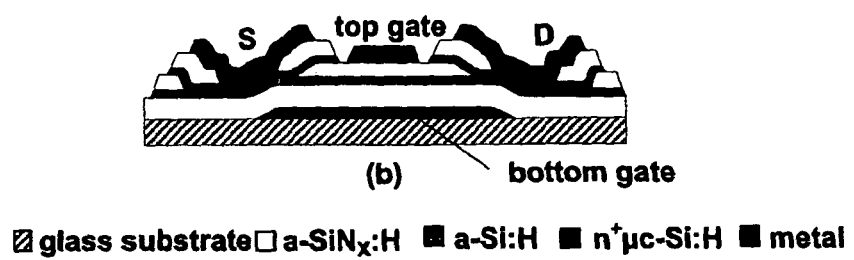
FIG. 3 shows a cross section view of a dual-gate TFT structure.

FIG. 3 illustrates the structure of a dual-gate TFT fabricated for this purpose, wherein reference numerals S and D denote a source and a drain, respectively. The fabrication steps are the same as of that of a normal inverted staggered TFT structure except that it requires a sixth mask for patterning the top gate. The length of the TFT may be around 30 µm to provide enough spacing between the source and drain for the top gate. The width may be made large (e.g. 1600 µm) by interconnecting four TFTs with W=400 µm (with four of these TFTs) in parallel to create a sizeable leakage current for measurement. A delay time is inserted in the measurement of the current to ensure that the measurement has passed the transient period created by defects in the a-Si:H active layer, which give rise to a time-dependent capacitance.

Figure 4:
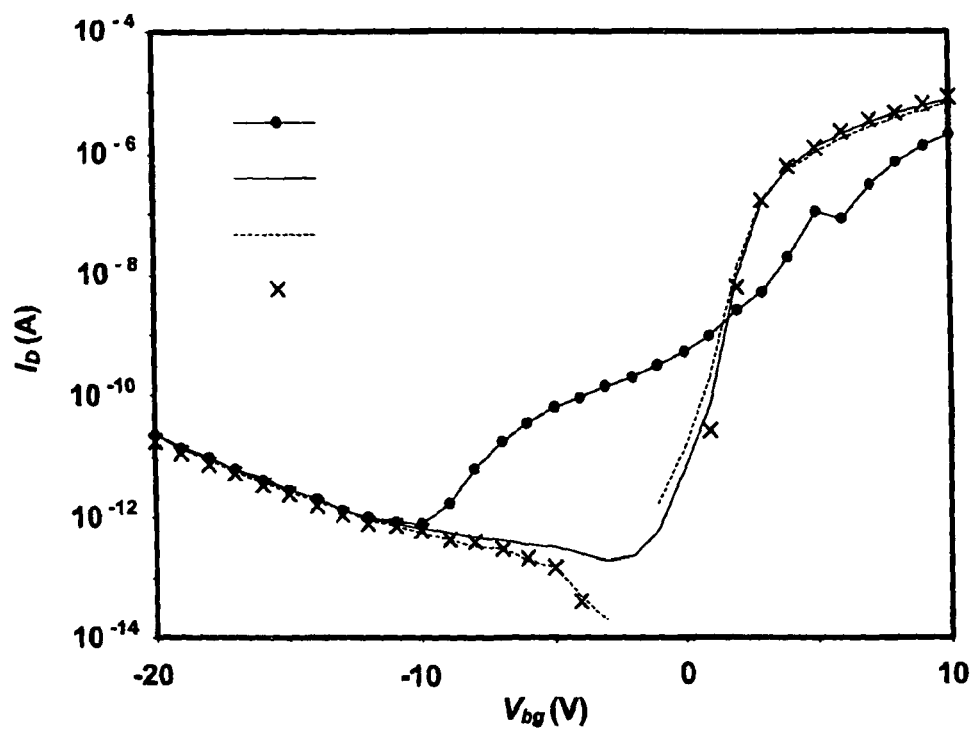
FIG. 4 shows forward and reverse transfer characteristics of dual-gate TFT for various top gate biases.

FIG. 4 shows results of static current measurements for four cases: first when the top gate is tied to −10V, second when the top gate is grounded, third when the top gate is floating, and lastly when the top gate is shorted to the bottom gate. In FIG. 4, $V_{tg}$ represents the bias voltage applied to the top gate of the TFT, and $V_{bg}$ represents the voltage applied to the bottom gate of the TFT.

With a floating top gate, the characteristics are almost similar to that of a normal single gate TFT. The leakage current is relatively high particularly when the top gate is biased with a negative voltage. The lowest values of leakage current are obtained when the top gate is pegged to either 0V or to the voltage of the bottom gate. In particular, with the latter the performance of the TFT in the (forward) sub-threshold regime of operation is significantly improved. This enhancement in sub-threshold performance can be explained by the forced shift of the effective conduction path away from the bottom interface to the bulk a-Si:H region due to the positive bias on the top gate. This in turn decreases the effect of the trap states at the bottom interface on the sub-threshold slope of the TFT.

Figure 5:
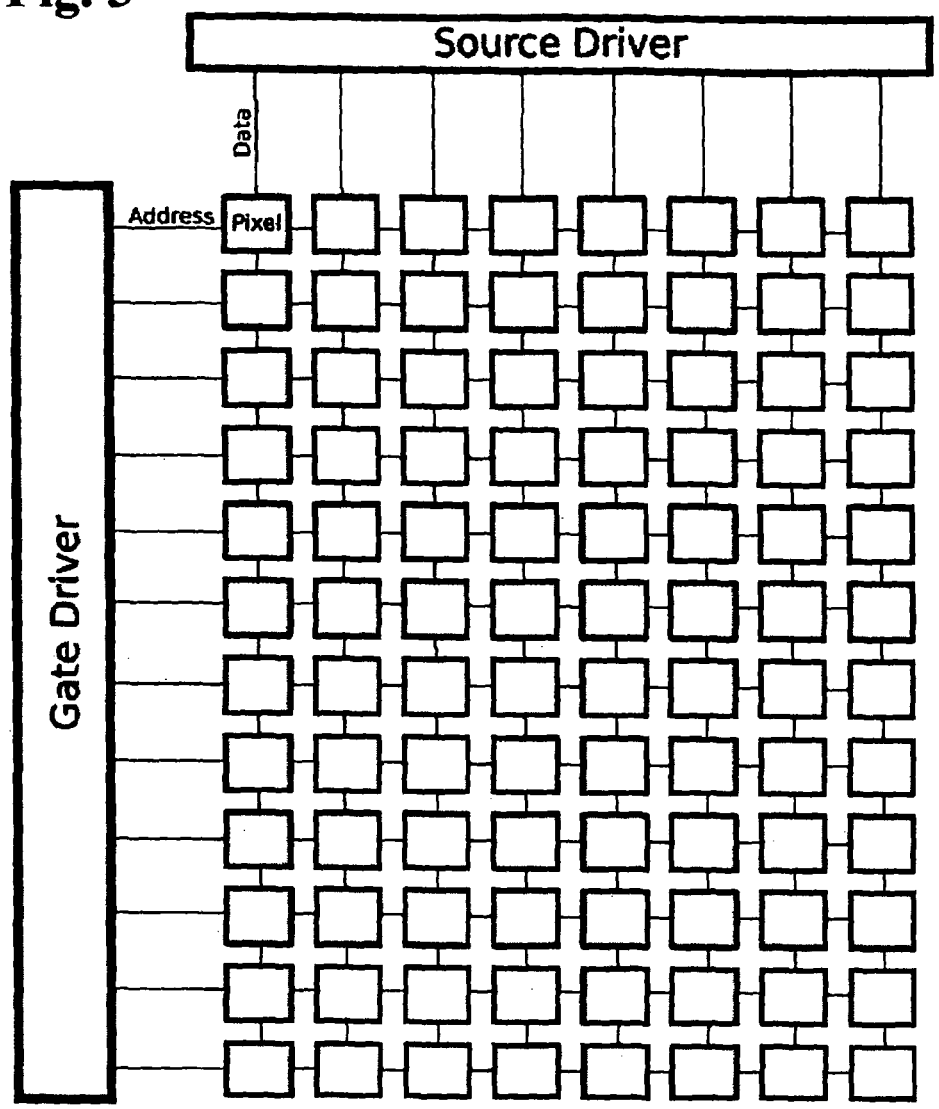
FIG. 5 shows a panel architecture of a AMOLED display.

It is noted that although the addition of another metal contact as the top gate reduces the leakage current of the TFT, it may potentially degrade pixel circuit performance by possible parasitic capacitances introduced by vertically stacking the OLED pixel. Thus the choice of top gate connection becomes important. For example, if the top gates in the pixel circuit are connected to the bottom gates of the associated TFTs, this gives rise to parasitic capacitances located between the gates and the cathode, which can lead to undesirable display operation (due to the charging up of the parasitic capacitance) when the gate driver drives the TFT switch as illustrated in FIG. 5. On the other hand, if the top gates are grounded, this results in the parasitic capacitance being grounded to yield reliable and stable circuit operation.

The OLED driver circuits considered here are the voltage-programmed 2-T driver of FIG. 6A, and the current-programmed $\Delta V_T$-compensated 5-T version of FIG. 7A. The 5-T driver circuit is a significant variation of the previous designs, leading to reduced pixel area, reduced leakage, lower supply voltage, higher linearity (−30 dB), and larger dynamic range (~40 dB).

Figure 6B:
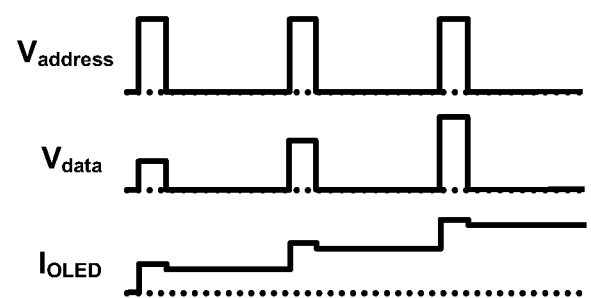
FIG. 6B shows input-output timing diagrams for the 2-T pixel circuit of FIG. 6A.

Before discussing the operation of the 5-T pixel driver circuit, the operation of the conventional voltage-driven 2-T pixel driver circuit will be described. FIG. 6A shows a 2-T pixel circuit including the 2-T pixel driver circuit, an OLED and a capacitor $C_s$. The 2-T pixel driver includes two TFTs $T_1$ and $T_2$. FIG. 6B shows input-output timing chart of the 2-T pixel circuit of FIG. 6A. $I_{OLED}$ represents the current passing through the OLED element and transistor $T_2$.

Referring to FIGS. 6A and 6B, when the address line is activated by $V_{address}$, the voltage on the data line ($V_{data}$) starts charging capacitor $C_s$ and the gate capacitance of the driver transistor $T_2$. Depending on the voltage on the data line, the capacitor charges up to turn the driver transistor $T_2$ on, which then starts conducting to drive the OLED with the appropriate level of current. When the address line is turned off, $T_1$ is turned off. However, the voltage at the gate of $T_2$ remains since the leakage current of $T_1$ is trivial in comparison. Hence, the current through the OLED remains unchanged after the turn off process. The OLED current changes only the next time around when a different voltage is written into the pixel.

FIG. 7A illustrates a 5-T pixel circuit having the 5-T pixel current driver circuit for an OLED display, an OLED, and a capacitor C. The 5-T pixel current driver circuit has five TFTs $T_1$-$T_5$. Unlike the 2-T pixel driver circuit of FIG. 6A, the data that is written into the 5-T pixel in this case is a current ($I_{data}$).

Figure 7B:
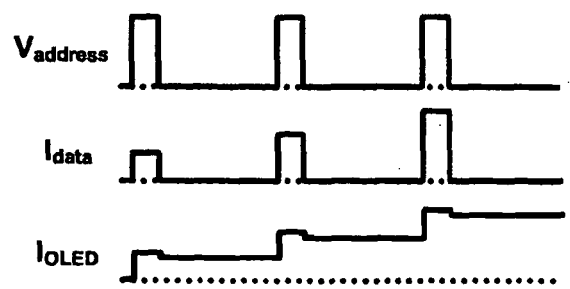
FIG. 7B shows input-output timing diagrams of the 5-T pixel circuit of FIG. 7A.

FIG. 7B shows input-output timing diagrams of the 5-T pixel circuit of FIG. 7A. Referring to FIGS. 7A and 7B, the address line voltage $V_{address}$ and the data line current $I_{data}$ are activated or deactivated simultaneously. When $V_{address}$ is activated, it forces $T_1$ and $T_2$ to turn on. $T_1$ immediately starts conducting but $T_2$ does not since $T_3$ and $T_4$ are off. Therefore, the voltages at the drain and source of $T_2$ become equal. The current flow through $T_1$ starts charging the gate capacitor of transistors $T_3$ and $T_5$, like the 2-T driver. The current of these transistors starts increasing and consequently $T_2$ starts to conduct current. Therefore, $T_1$'s share of $I_{data}$ reduces and $T_2$'s share of $I_{data}$ increases. This process continues until the gate capacitors of $T_3$ and $T_5$ charge (via $T_1$) to a voltage that forces the current of $T_3$ to be $I_{data}$. At this time, the current of $T_1$ is zero and the entire $I_{data}$ goes through $T_2$ and $T_3$. At the same time, $T_5$ drives a current through the OLED, which is ideally equal to $I_{data}*(W_5/W_3)$. $(W_5/W_3)$ signifies a current gain where $W_5$ represents channel width of $T_5$, and $W_3$ represents channel width of $T_3$. Now if $I_{data}$ and $V_{address}$ are deactivated, $T_2$ will turn off, but due to the presence of capacitances in $T_3$ and $T_5$, the current of these two devices cannot be changed easily, since the capacitances keep the bias voltages constant. This forces $T_4$ to conduct the same current as that of $T_3$, to enable the driver $T_5$ to drive the same current into the OLED even when the write period is over. Writing a new value into the pixel then changes the current driven into the OLED.

Figure 8:
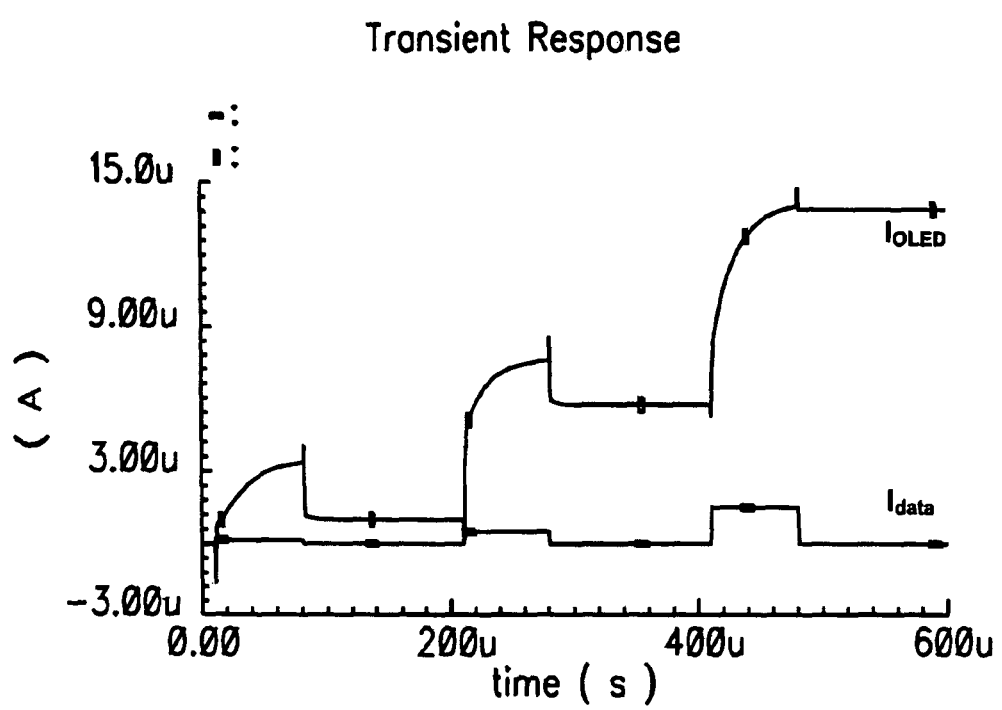
FIG. 8 shows transient performance of the 5-T pixel current driver circuit of FIG. 7A for three consecutive write cycles.

The result of transient simulation for the 5-T current driver circuit of FIG. 7A is shown in FIG. 8. As can be seen, the circuit has a write time of <70 µs, which is acceptable for most applications. The 5-T current driver circuit does not increase the required pixel size significantly (FIG. 1), since the sizes of $T_2$, $T_3$, and $T_4$ are scaled down. This also provides an internal gain ($W_5/W_3$=8), which reduces the required input current to <2 µA for 10 µA OLED current.

Figure 9:
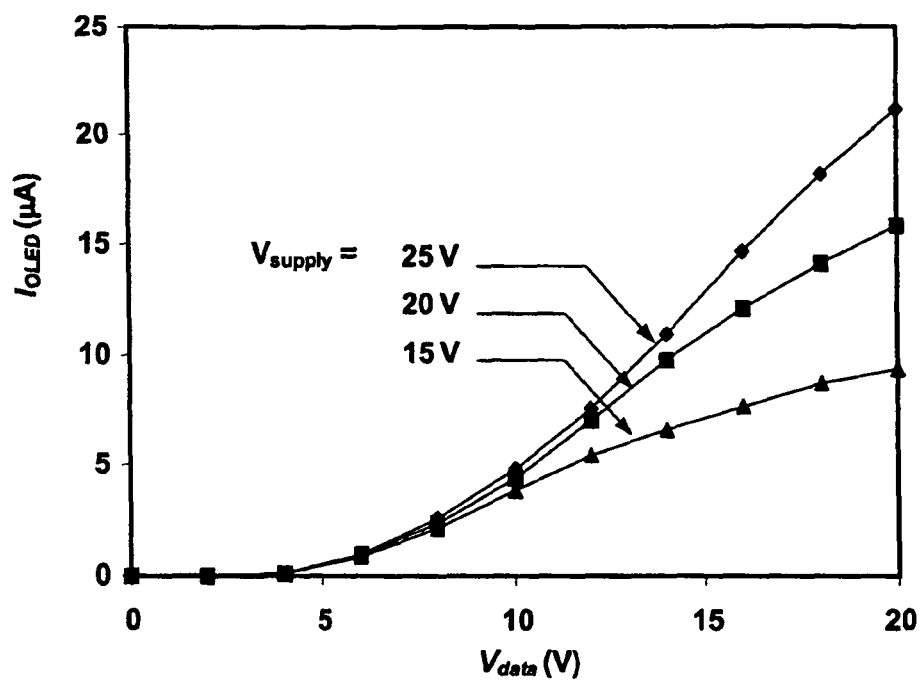
FIG. 9 shows input-output transfer characteristics for the 2-T pixel driver circuit of FIG. 6A for different supply voltages.
Figure 10:
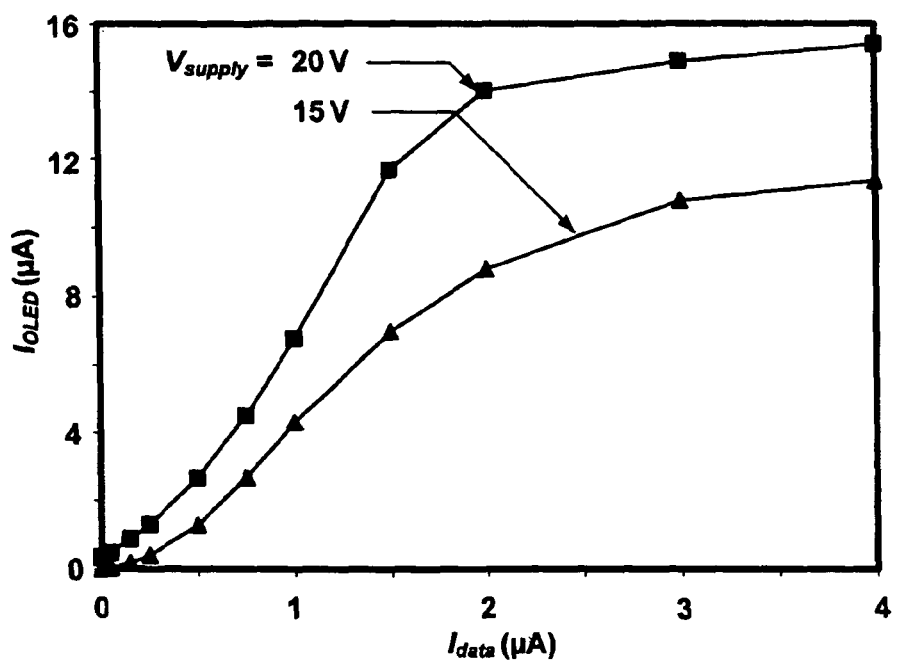
FIG. 10 shows input-output transfer characteristics for the 5-T pixel current driver circuit of FIG. 7A for different supply voltages.

The transfer characteristics for the 2-T and 5-T driver circuits of FIGS. 6A and 7A are illustrated in FIGS. 9 and 10, respectively, generated using reliable physically-based TFT models for both forward and reverse regimes. A much improved linearity (~30 dB) in the transfer characteristics ($I_{data}/I_{OLED}$) is observed for the 5-T driver circuit due to the geometrically-defined internal pixel gain as compared to similar designs. In addition, there are two components (OLED and $T_5$) in the high current path, which in turn decreases the required supply voltage and hence improves the dynamic range. According to FIG. 10, a good dynamic range (~40 dB) is observed for supply voltage of 20V and drive currents in the range $I_{OLED} \leq 10\,\mu A$, which is realistic for high brightness.

Figure 11:
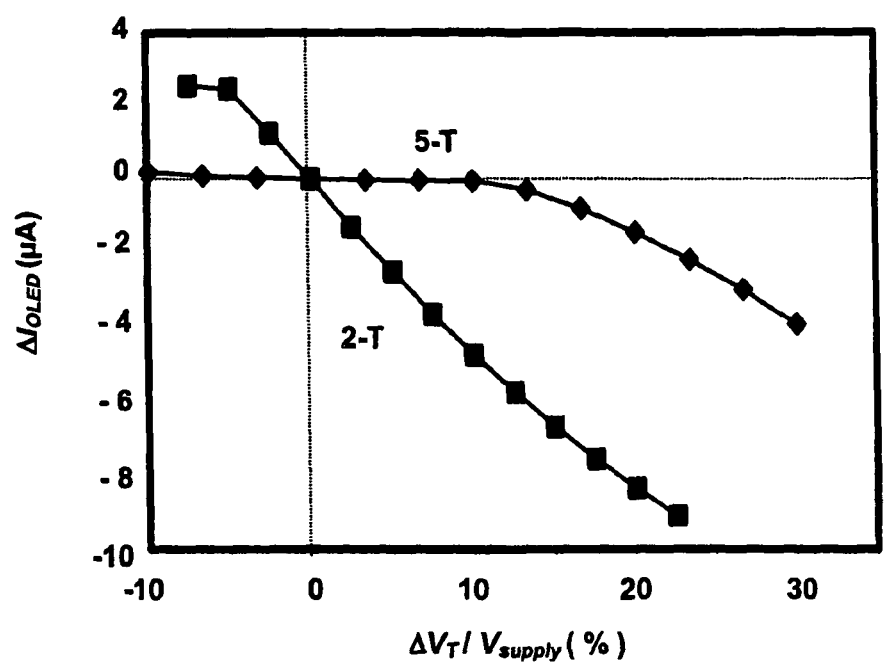
FIG. 11 shows variation in OLED current as a function of the normalized shift in threshold voltage.

FIG. 11 illustrates variation in the OLED current with the shift in threshold voltage for the 2-T and 5-T driver circuits of FIGS. 6A and 7A.

In FIG. 11, the graph having a mark "■" represents the OLED current when using the 2-T pixel driver circuit, and the graph having a mark "♦" represents the OLED current when using the 5-T pixel driver circuit.

The 5-T current driver circuit compensates for the shift in threshold voltage particularly when the shift is smaller than 10% of the supply voltage. This is because the 5-T current driver circuit is current-programmed. In contrast, the OLED current in the 2-T driver circuit changes significantly with a shift in threshold voltage. The 5-T current driver circuit described here operates at much lower supply voltages, has a much larger drive current, and occupies less area.

The pixel architectures are compatible to surface (top) emissive AMOLED displays that enable high on-pixel TFT integration density for uniformity in OLED drive current and high aperture ratio. The 5-T driver circuit of FIG. 7A provides on-pixel gain, high linearity (~30 dB), and high dynamic range (~40 dB) at low supply voltages (15-20V) compared to the similar designs (27V). The results described here illustrate the feasibility of using a-Si:H for 3-inch mobile monochrome display applications on both glass and plastic substrates. With the latter, although the mobility of the TFT is lower, the size of the drive transistor can be scaled up yet meeting the requirements on pixel area as depicted in FIG. 1.

As described above, the TFT may be, but not limited to, a polysilicon-based TFT. Polysilicon has higher electron and hole mobilities than amorphous silicon. The hole mobilities are large enough to allow the fabrication of p-channel TFTs.

Figure 12:
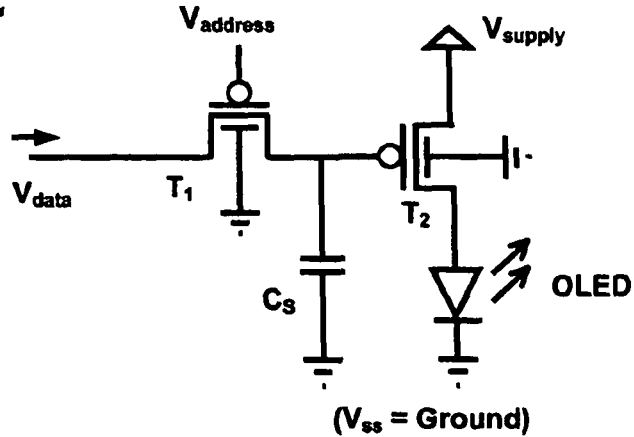
FIG. 12 shows a pixel circuit including a conventional 2-T polysilicon based pixel driver circuit having p-channel drive TFTs.

The advantage of having p-channel TFTs is that bottom emissive OLEDs can be used along with a p-channel drive TFT to make a good current source. One such circuit is shown in FIG. 12. FIG. 12 illustrates a pixel circuit having a conventional 2-T polysilicon based pixel current driver circuit. The 2-T polysilicon based pixel current driver circuit has a p-channel drive TFT. In FIG. 12, $T_1$ and $T_2$ are p-channel TFTs.

In FIG. 12, the source of the p-type drive TFT is connected to $V_{supply}$. Therefore, Vgs, gate-to-source voltage, and hence the drive current of the p-type TFT is independent of OLED characteristics. In other words, the driver shown in FIG. 12 performs as a good current source. Hence, bottom emissive OLEDs are suitable for use with p-channel drive TFTs, and top emissive OLEDs are suitable for use with n-channel TFTs.

The trade-off with using polysilicon is that the process of making polysilicon TFTs requires much higher temperatures than that of amorphous silicon. This high temperature-processing requirement greatly increases the cost, and is not amenable to to plastic substrates. Moreover, polysilicon technology is not as mature and widely available as amorphous silicon. In contrast, amorphous silicon is a well-established technology currently used in liquid crystal displays (LCDs).

It is due to these reasons that amorphous silicon combined with top emissive OLED based circuit designs is most promising for AMOLED displays.

Compared to polysilicon TFTs, amorphous silicon TFTs are n-type and thus are more suitable for top emission circuits as shown in FIG. 2, and doesn't preclude their use in full colour bottom emission circuits either. However, amorphous silicon TFTs have inherent stability problems due to the material structure. In amorphous silicon circuit design, the biggest hurdle is the increase in threshold voltage $V_{th}$, after prolonged gate bias. This shift is particularly evident in the drive TFT of an OLED display pixel. This drive TFT is always in the 'ON' state, in which there is a positive voltage at its gate. As a result, its $V_{th}$, increases and the drive current decreases based on the current-voltage equation below:

$$Ids = (\mu C_{ox} W/2L)(V_{gs} - V_{th})^2 \text{ (in Saturation region)}$$

where Ids represents drain to source current; μ represents mobility; $C_{ox}$ represents gate capacitance; W represents channel width; L represents channel length; $V_{gs}$ represents gate to source voltage; and $V_{th}$, represents threshold voltage.

In the display, this would mean that the brightness of the OLED would decrease over time, which is unacceptable. Hence, the 2-T driver circuits as described above are not practical for OLED displays, as they do not compensate for any increase in $V_{th}$.

By contrast, the current mirror based pixel current driver circuit illustrated in FIG. 7A automatically compensates for shifts in the $V_{th}$ of the drive TFT in a pixel.

Figure 15:
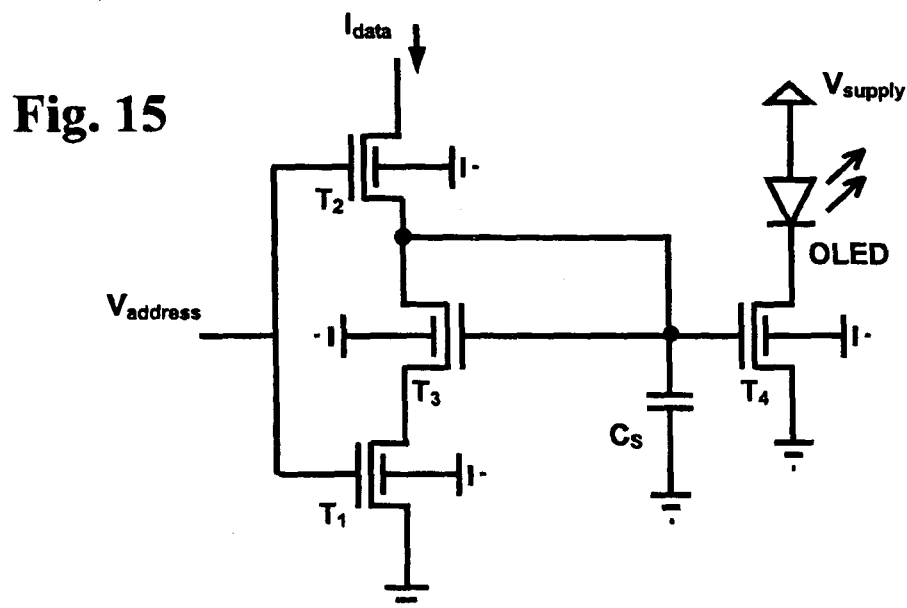
FIG. 15 shows a pixel circuit including a 4-T pixel current driver circuit for an OLED display in accordance with a further embodiment of the present invention.
Figure 16:
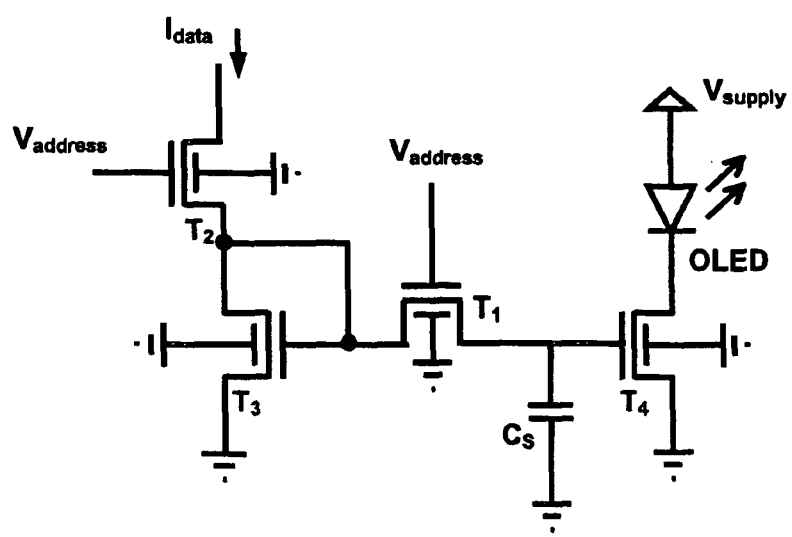
FIG. 16 shows a pixel circuit including a 4-T pixel current driver circuit for an OLED display in accordance with a further embodiment of the present invention.
Figure 17:
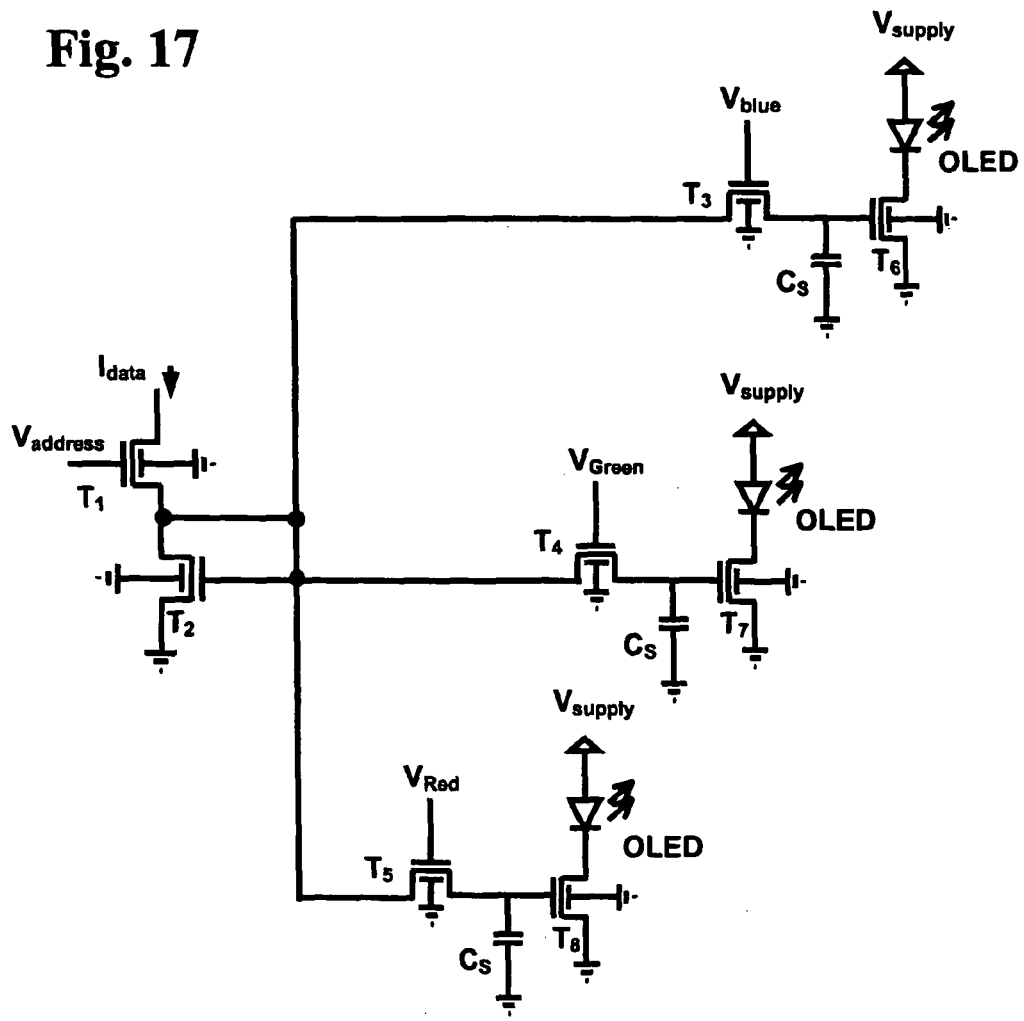
FIG. 17 shows a pixel circuit including a pixel current driver circuit for a full color, OLED display in accordance with a further embodiment of the present invention.

FIGS. 13-17 illustrate pixel circuits having pixel current driver circuits in accordance with further embodiments of the present invention. Each of the pixel circuits shown in FIGS. 13-16 includes a 4-T pixel current driver circuit, an OLED and a capacitor $C_s$. The pixel circuit shown in FIG. 17 includes a pixel current driver circuit, OLEDs, and capacitors $C_s$. While the pixel current driver circuits of FIGS. 13-16 are presented for a monochrome OLED display, the pixel current driver circuits of FIGS. 13-16 are, however, applicable to a full color display. The pixel current driver circuit of FIG. 17 is provided for a full colour, OLED display.

The pixel driver circuits of FIGS. 13-17 are current mirror based pixel driver circuits. All these circuits illustrated in FIGS. 13-17 have mechanisms that automatically compensate for the $V_{th}$ shift of a drive TFT.

Figure 13:
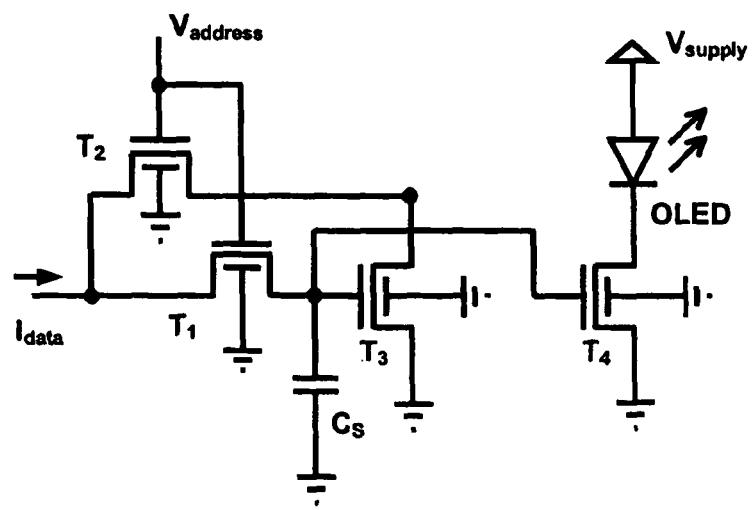
FIG. 13 shows a pixel circuit including a 4-T pixel current driver circuit for an OLED display in accordance with a further embodiment of the present invention.

The pixel current driver circuit of FIG. 13 is a modification of the 5-T pixel driver circuit of FIG. 7A. The 4-T pixel current driver circuit of FIG. 13 has four TFTs, $T_1$-$T_4$. The 4-T pixel current driver circuit of FIG. 13 compensates for the shift of $V_{th}$ of $T_4$. The 4-T pixel current driver circuit of FIG. 13 occupies a smaller area than that of the 5-T pixel current driver circuit, and provides a higher dynamic range. The higher dynamic range allows for a larger signal swing at the input, which means that the OLED brightness can be adjusted over a larger range.

Figure 14:
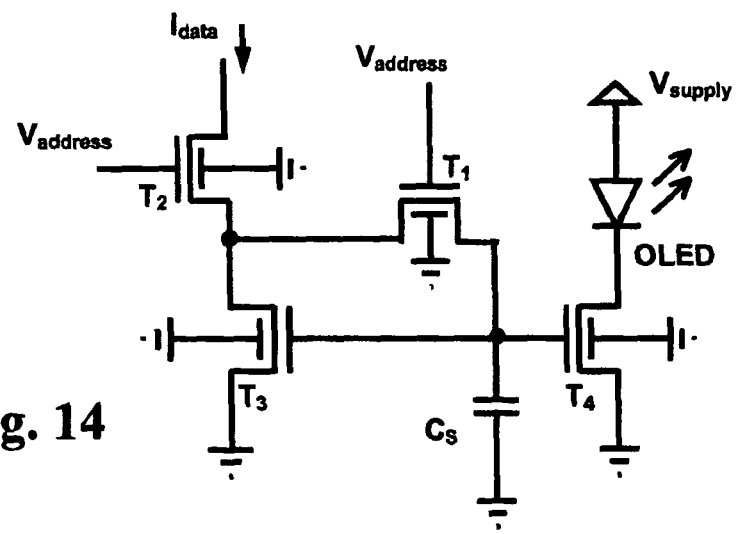
FIG. 14 shows a pixel circuit including a 4-T pixel current driver circuit for an OLED display in accordance with a further embodiment of the present invention.

The 4-T pixel current driver circuit of FIG. 14 has four TFTs, $T_1$-$T_4$, and has a lower discharge time. The 4-T pixel current driver circuit of FIG. 14 compensates for the shift of $V_{th}$ of $T_4$. The advantage of this circuit is that the discharge time of the capacitor $C_s$ is substantially reduced. This is because the discharge path has two TFTs (as compared to three TFTs in the circuit of FIG. 13). The charging time remains the same. The other advantage is that there is an additional gain provided by this circuit because $T_3$ and $T_4$ do not have the same source voltages. However, this gain is non-linear and may not be desirable in some cases.

The 4-T pixel current driver circuit of FIG. 15 has four TFTs, $T_1$-$T_4$. The 4-T pixel current driver circuit of FIG. 15 compensates for the shift of $V_{th}$ of $T_4$. This circuit does not have the non-linear gain present in the pixel driver circuit of FIG. 14, since the source terminals of $T_3$ and $T_4$ are at the same voltage. It still maintains the lower capacitance discharge time, along with the other features of the circuit of FIG. 9.

The 4-T pixel current driver circuit of FIG. 16 has four TFTs, $T_1$-$T_4$. The 4-T pixel current driver circuit of FIG. 16 compensates for the shift of $V_{th}$ of $T_4$. This circuit forms the building block for the 3-colour RGB circuit shown in FIG. 17. It also has a low capacitance discharge time and high dynamic range.

The full colour circuit shown in FIG. 17 minimizes the area required by an RGB pixel on a display, while maintaining the desirable features like threshold voltage shift compensation, in-pixel current gain, low capacitance discharge time, and high dynamic range. In FIG. 17, $V_{blue}$, $V_{Green}$, $V_{Red}$ represent control signals for programming the blue, green, and red pixels, respectively. The pixel current driver circuit of FIG. 17 compensates for the shift of $V_{th}$ of $T_6$.

The circuits described above may be fabricated using normal inverted staggered TFT structures. The length and width of the thin film transistors may change depending on the maximum drive current required by the circuit and the fabrication technology used.

The pixel current driver circuits of FIGS. 7 and 13-17 use n-type amorphous silicon TFTs. With the above structure on the a-Si:H current driver according to the embodiments of the present invention, the charge induced in the top channel of the TFT is minimized, and the leakage currents in the TFT is minimized so as to enhance circuit performance.

However, polysilicon technology may be applied to the pixel current driver circuits using p-type or n-type TFTs. These circuits, when made in polysilicon, can compensate for the spatial non-uniformity of the threshold voltage. The p-type circuits are conjugates of the above-mentioned circuits and are suitable for the bottom emissive pixels.

Figure 18:
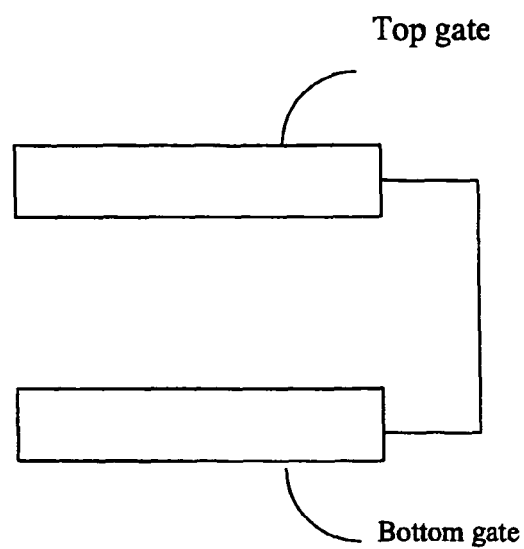
FIG. 18 shows a schematic diagram of the top gate and the bottom gate of a dual gate transistor where the top gate is electrically connected to the bottom gate.

In FIGS. 6A, 7A, and 12-17, the TFT having dual gates is shown, where the dual gate includes a top gate and a bottom gate. The top gate may be grounded (for example, in FIGS. 6A, 7A and 12-17), or electrically tied to a bottom gate (FIG. 18).

The dual-gate TFTs are used in the above-mentioned circuits to enable vertical integration of the OLED layers with minimum parasitic effects. However, the above-mentioned circuits compensate for the $V_{th}$ shift when the circuits comprise single-gate TFTs.

FIGS. 19-24 illustrate pixel current driver circuits having single-gate TFTs. FIGS. 19-24 correspond to FIGS. 7A and 13-17, respectively.

Figure 19:
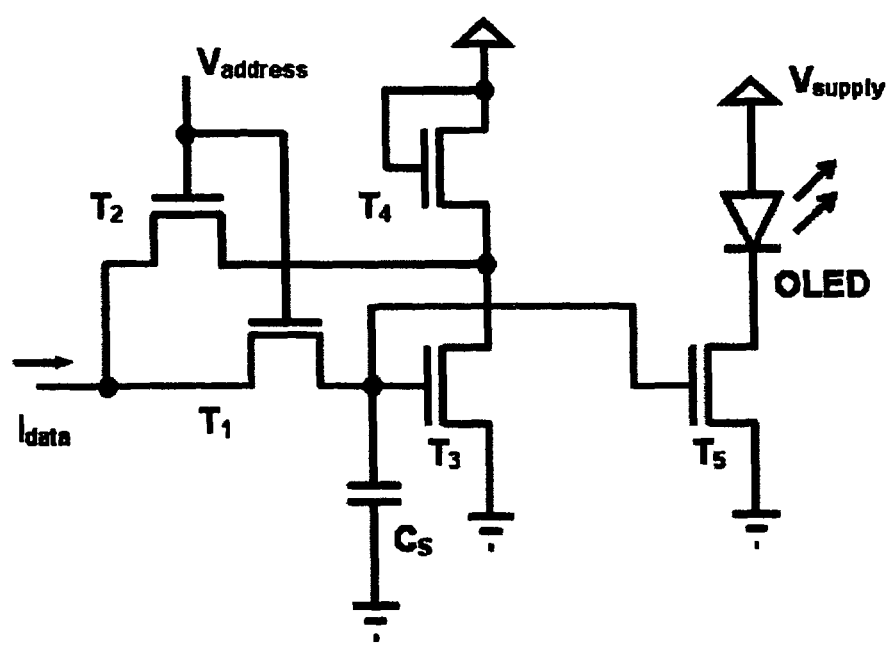
FIG. 19 shows a pixel circuit including a 5-T pixel current driver circuit in accordance with a further embodiment of the present invention.
Figure 20:
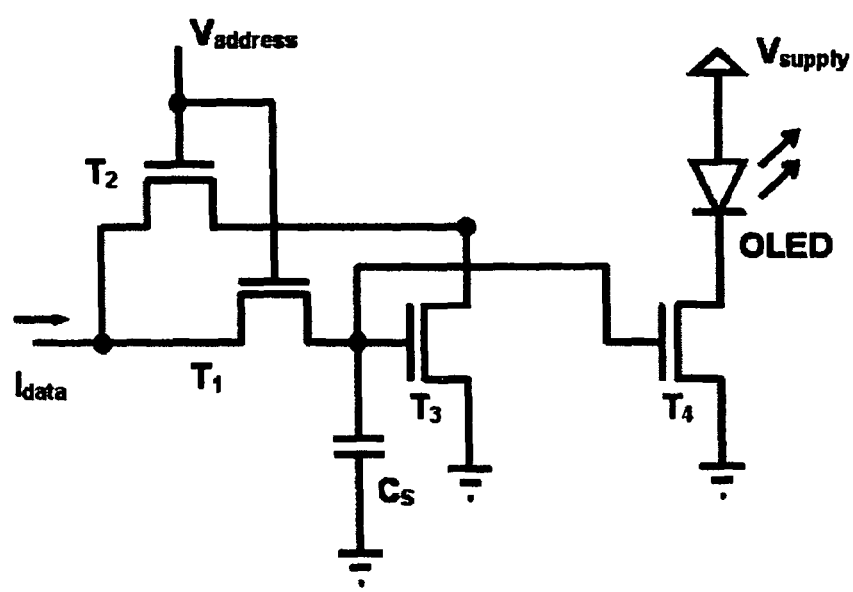
FIG. 20 shows a pixel circuit including a 4-T pixel current driver circuit in accordance with a further embodiment of the present invention.
Figure 21:
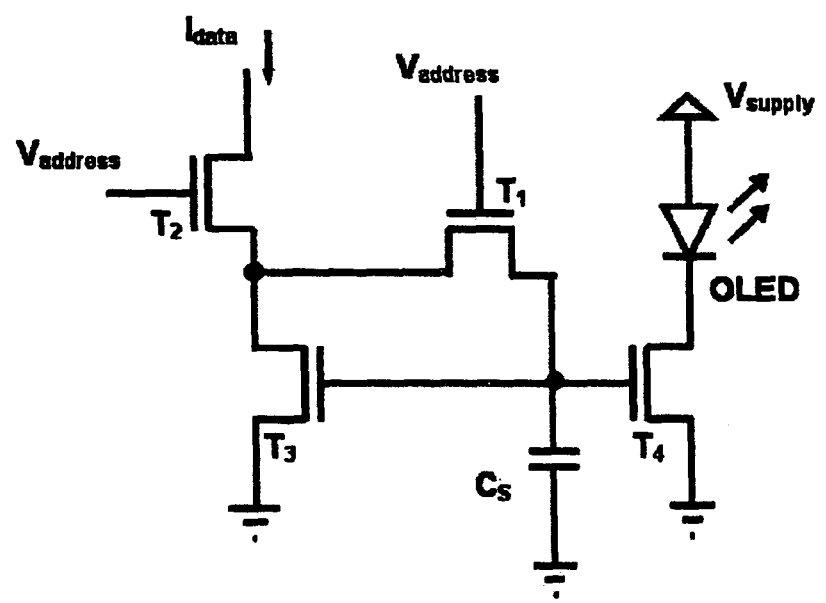
FIG. 21 shows a pixel circuit including a 4-T pixel current driver circuit in accordance with a further embodiment of the present invention.
Figure 22:
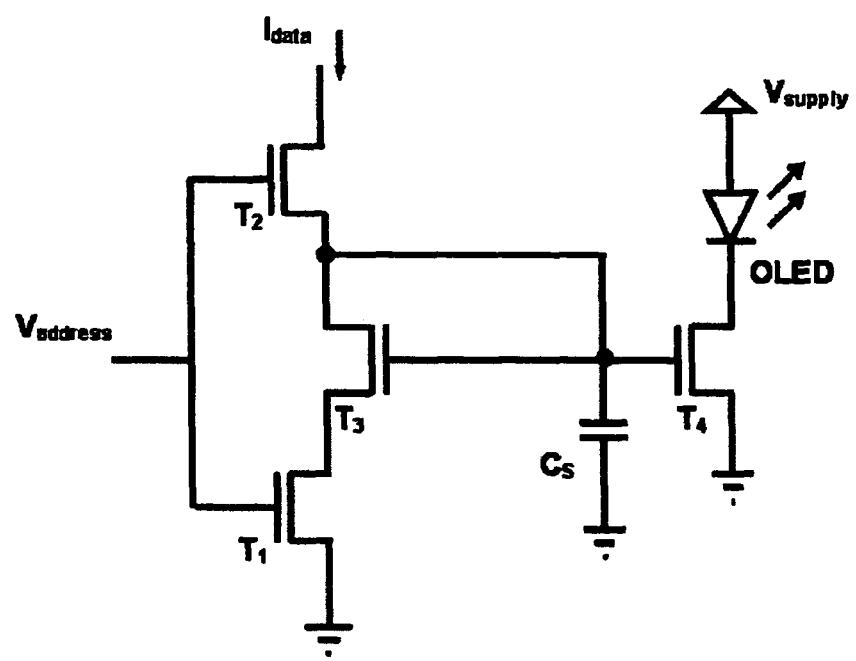
FIG. 22 shows a pixel circuit including a 4-T pixel current driver circuit in accordance with a further embodiment of the present invention.
Figure 23:
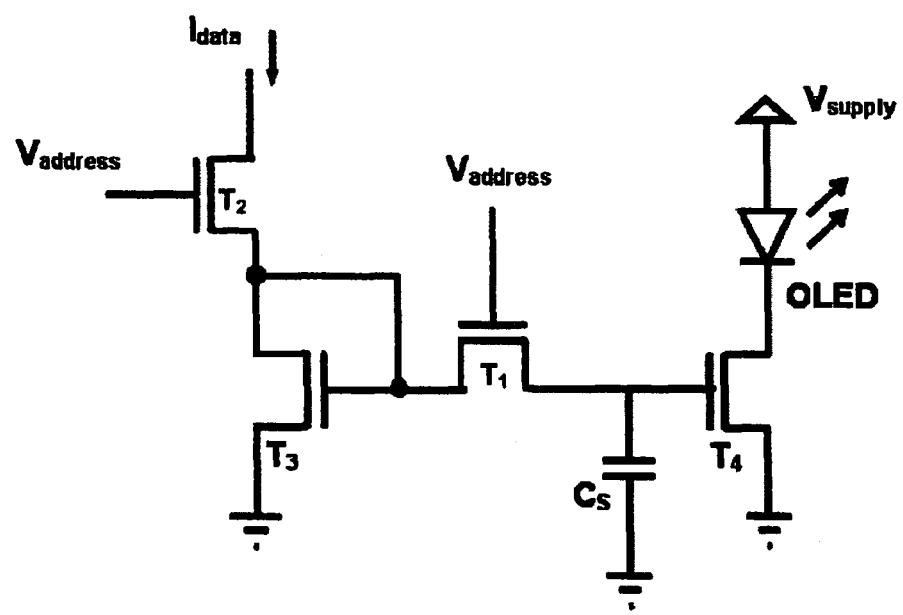
FIG. 23 shows a pixel circuit including a 4-T pixel current driver circuit in accordance with a further embodiment of the present invention.
Figure 24:
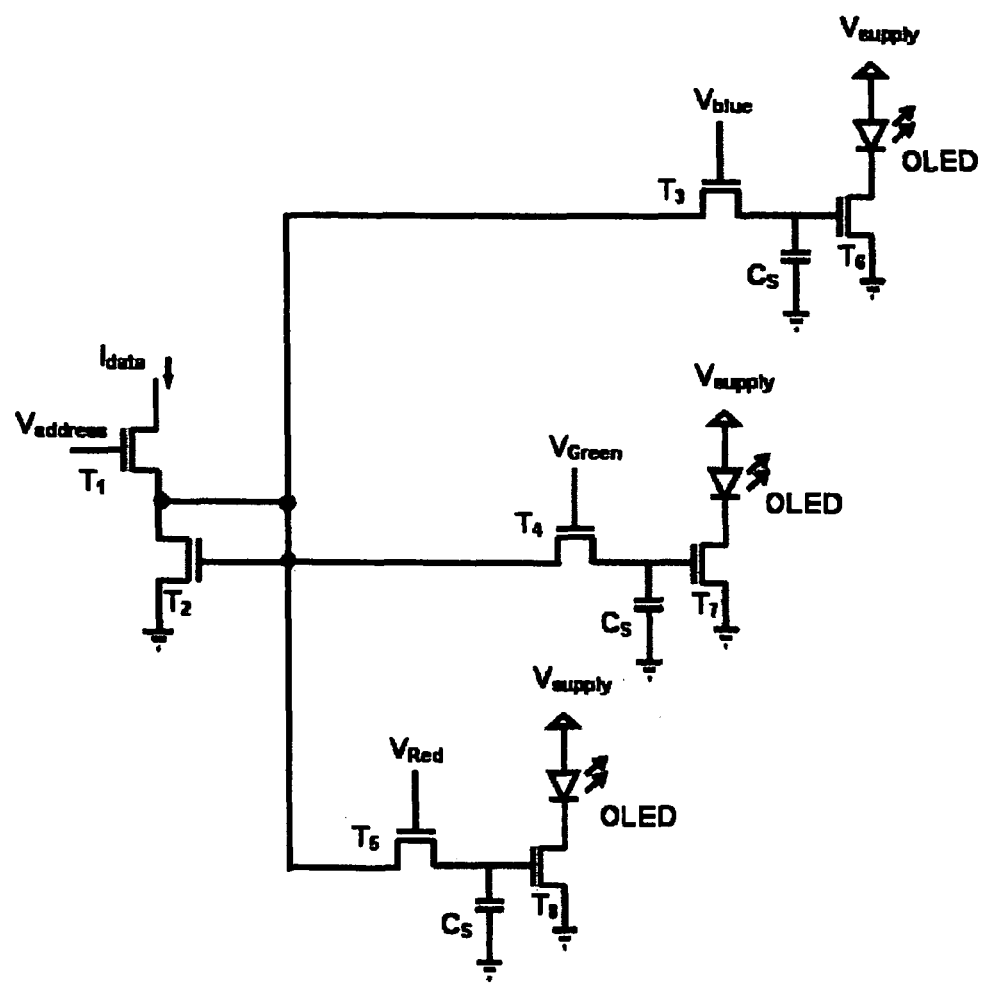
FIG. 24 shows a pixel circuit including a pixel current driver circuit for a full color display in accordance with a further embodiment of the present invention.
Figure 25:
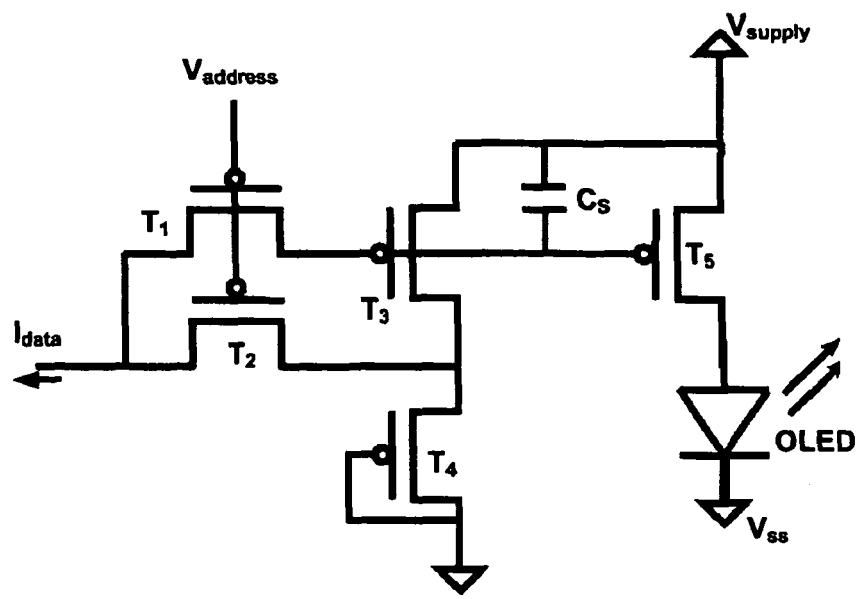
FIG. 25 shows a pixel circuit including a 5-T pixel current driver circuit in accordance with a further embodiment of the present invention.
Figure 26:
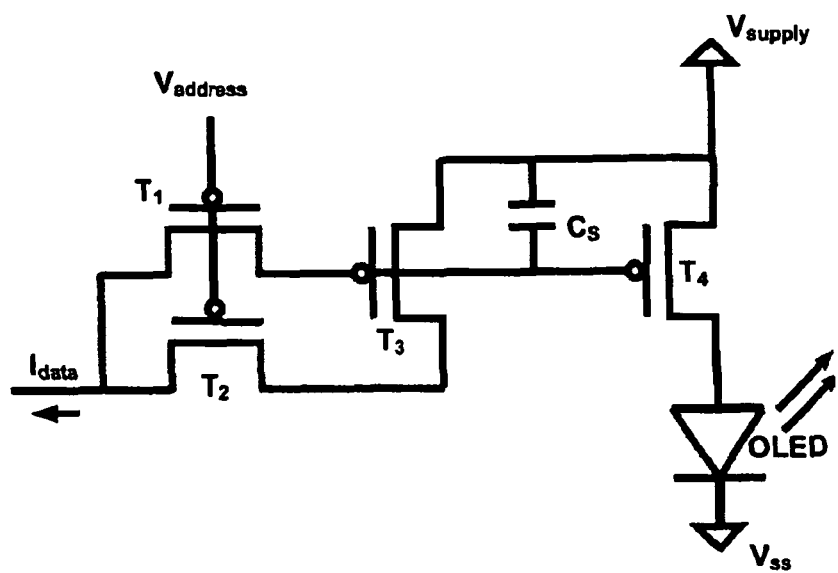
FIG. 26 shows a pixel circuit including a 4-T pixel current driver circuit in accordance with a further embodiment of the present invention.
Figure 27:
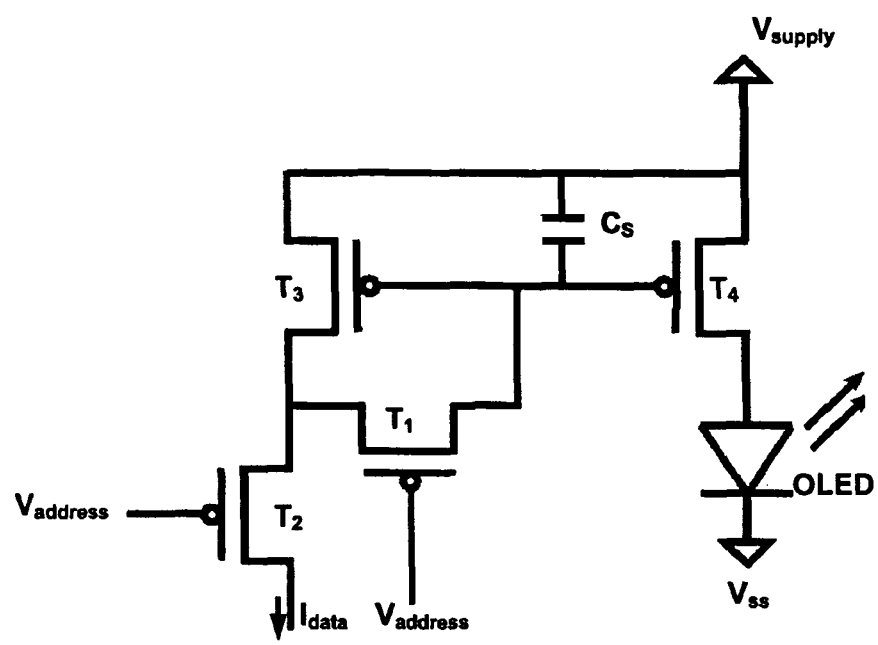
FIG. 27 shows a pixel circuit including a 4-T pixel current driver circuit in accordance with a further embodiment of the present invention.
Figure 28:
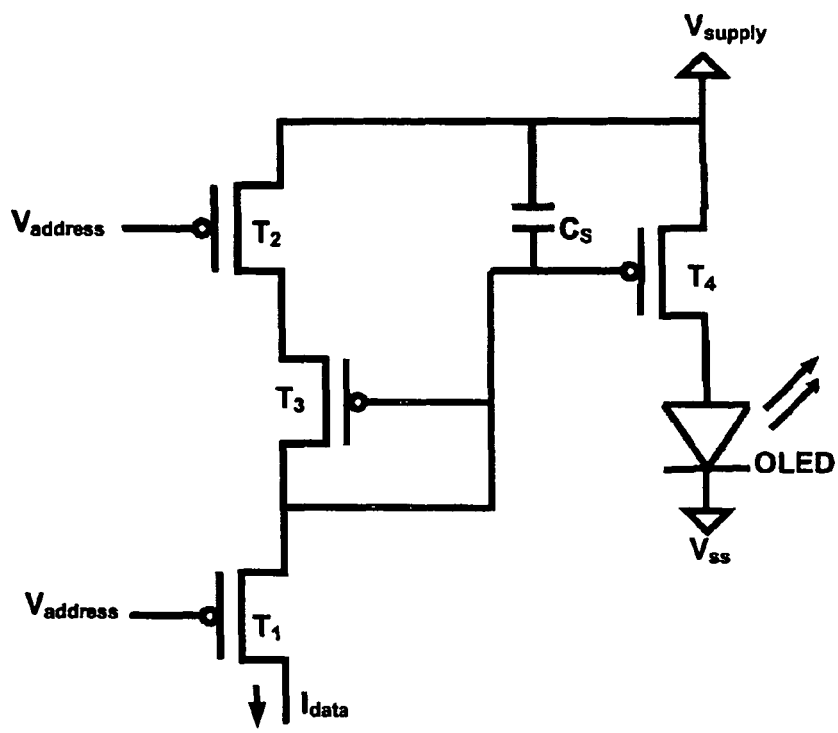
FIG. 28 shows a pixel circuit including a 4-T pixel current driver circuit in accordance with a further embodiment of the present invention.
Figure 29:
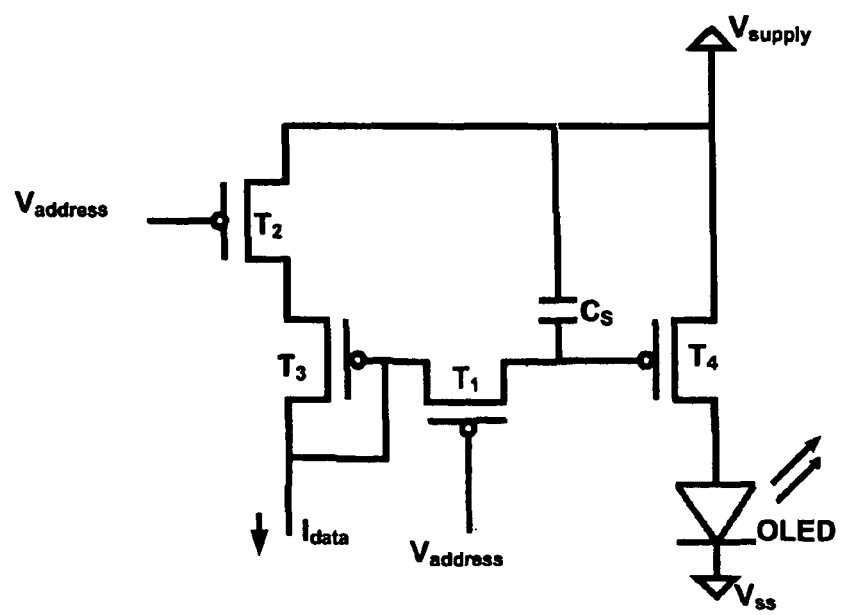
FIG. 29 shows a pixel circuit including a 4-T pixel current driver circuit in accordance with a further embodiment of the present invention.
Figure 30:
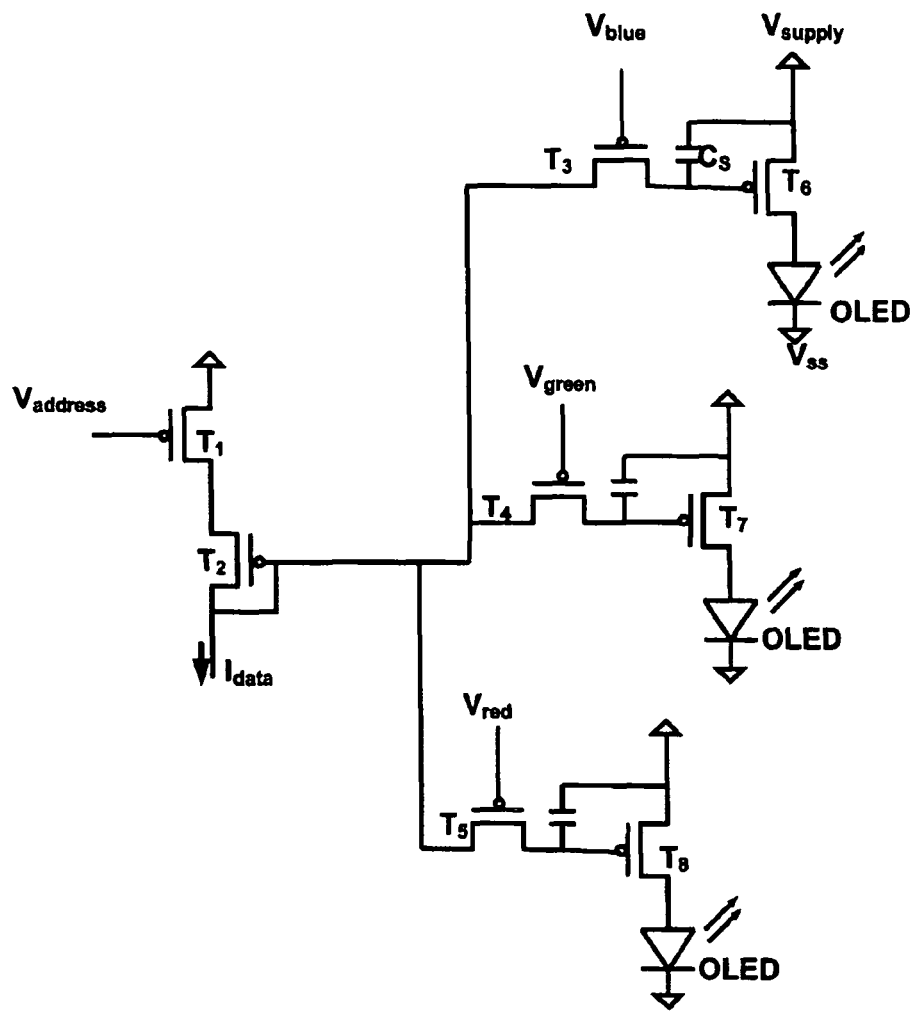
FIG. 30 shows a pixel circuit including a pixel current driver circuit for a full color display in accordance with a further embodiment of the present invention.

For example, the pixel current driver circuit of FIG. 19 contains single-gate TFTs having a switch TFT $T_1$, a feedback TFT $T_2$, a reference TFT $T_3$, a diode-use TFT $T_4$, and a drive TFT $T_5$. The pixel current driver circuit of FIG. 20 contains single-gate TFTs having a switch TFT $T_1$, a feedback TFT $T_2$, a reference TFT $T_3$, and a drive TFT $T_4$. The pixel current driver circuit of FIG. 22 contains single-gate TFTs having a feedback TFT $T_1$, a switch TFT $T_2$, a reference TFT $T_3$, and a drive TFT $T_4$. The pixel current driver circuit of FIG. 24 contains single-gate TFTs having switch TFTs $T_1$, $T_3$, $T_4$, $T_5$, a feedback TFT $T_2$, and drive TFT $T_6$, $T_7$, $T_8$.

The driving scheme and operation of the pixel driver circuits of FIGS. 19-24 are same as those of FIGS. 7A and 13-17. The major difference between the pixel current driver circuit having dual-gate TFTs and the pixel current driver circuit having single-gate TFTs is that the pixel current driver circuit having the dual-gate TFTs utilize a better TFT design which minimizes the leakage currents in the TFTs, thus enhancing circuit performance. However, the single-gate TFTs are the standard and preferred design in industry.

In FIGS. 19-24, n-type TFTs are shown. However, the pixel current driver circuits having single-gate TFTs may include p-type TFTs. Pixel driver circuits with p-type TFTs are shown in FIG. 25-30, where the circuits for FIGS. 25-30 are analogous to those of FIG. 19-24, respectively.

With regard to the current driver circuits of FIGS. 19-30 the OLEDs can be either non-inverted or inverted. The four possible cases are presented in Table 1.

TABLE 1

Possible OLED connections.

| | Bottom Emission | Top Emission |
|---|---|---|
| OLED connected at source of drive TFT | Reduced aperture ratio Regular OLED - transparent anode OLED current depends on OLED voltage which changes with aging - undesirable location Safeguards against small variation in drive current by source degeneration | Large aperture ratio Regular OLED - transparent cathode. OLED current depends on OLED voltage which changes with aging - undesirable location Safeguards against small variation In drive current by source degeneration |
| OLED connected at drain of drive TFT | Reduced aperture ratio inverted OLED - transparent cathode OLED current independent of OLED voltage | Large aperture ratio Inverted OLED - transparent anode OLED current Independent of OLED voltage |

The present invention has been described with regard to one or more embodiments. However, it will be apparent to persons skilled in the art that a number of variations and modifications can be made without departing from the scope of the invention as defined in the claims.

What is claimed is:

1. A pixel driver circuit comprising:
   a light-emitting device,
   an address line;
   a data line;
   a switch thin film transistor, a first node of the switch transistor being connected to the data line and a gate of the switch transistor being connected to the address line;
   a feedback thin film transistor, a gate of the feedback transistor being connected to the address line, and a second node of the feedback transistor being connected to the data line;
   a reference thin film transistor, a first node of the reference transistor being connected to the light-emitting device, a gate of the reference transistor being connected to the second node of the switch transistor, and a second node of the reference transistor being connected to a first node of the feedback transistor; and
   a drive thin film transistor, a gate of the drive transistor being connected to the gate of the reference transistor, and a first node of the drive transistor being connected to a potential, and a second node of the drive transistor being connected to the light-emitting device.

2. The pixel driver circuit according to claim 1, wherein at least one of the thin film transistors is an amorphous silicon based thin film transistor.

3. The pixel driver circuit according to claim 1, wherein at least one of the thin film transistor is a polycrystalline silicon based thin film transistor.

4. The pixel driver circuit according to claim 1, wherein at least one of the thin film transistors is a n-type thin film transistor.

5. The pixel driver circuit according to claim 1, wherein at least one of the thin film transistors is a p-type thin film transistor.

6. The pixel driver circuit according to claim 1, wherein the thin film transistors each comprise a second gate.

7. The pixel driver circuit according to claim 1, wherein the first node of the reference transistor is a drain node, and wherein the second node of the reference transistor is a source node.

8. The pixel driver circuit according to claim 1, wherein the second node of the feedback transistor is connected to a ground potential.

9. The pixel driver circuit according to claim 1, wherein the second node of the feedback transistor is connected to a voltage supply.

10. The pixel driver circuit according to claim 1, comprising a capacitor connected to the gate of the drive transistor and a ground potential.

11. The pixel driver circuit according to claim 1, comprising a capacitor connected to the gate of the drive transistor and a voltage supply.

12. A pixel circuit comprising a pixel driver circuit according to claim 1; and
an organic light emitting diode, the one of a first node and a second node of the drive transistor being connected to the organic light emitting diode.

13. The pixel circuit according to claim 12, wherein the one of the first node and the second node of the drive transistor is connected to the organic light emitting diode, and wherein the other node is connected to a ground potential.

14. The pixel circuit according to claim 12, wherein the one of the first node and the second node of the drive transistor is connected to the organic light emitting diode, and wherein the other node is connected to a voltage supply.

15. The pixel circuit according to claim 12, wherein the one of the first node and the second node of the drive transistor is a drain, and wherein the other is a source.

16. The pixel circuit according to claim 12, comprising a capacitor connected between the gate of the drive transistor and a ground potential.

17. The pixel circuit according to claim 12, comprising a capacitor connected between the gate of the drive transistor and a voltage supply.

18. The pixel circuit according to claim 12, wherein the pixel circuit is arranged for a monochrome display.

19. The pixel circuit according to claim 12, wherein the pixel circuit is arranged for a full color display.

* * * * *